United States Patent
Uchida

(10) Patent No.: US 7,483,331 B2
(45) Date of Patent: Jan. 27, 2009

(54) SEMICONDUCTOR MEMORY, MEMORY SYSTEM, AND OPERATION METHOD OF MEMORY SYSTEM

(75) Inventor: Toshiya Uchida, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 277 days.

(21) Appl. No.: 11/455,673

(22) Filed: Jun. 20, 2006

(65) Prior Publication Data
US 2007/0217278 A1    Sep. 20, 2007

(30) Foreign Application Priority Data
Mar. 17, 2006    (JP)    ............... 2006-074533

(51) Int. Cl.
*G11C 8/00*    (2006.01)

(52) U.S. Cl. ............... 365/230.03; 365/230.06; 365/189.04; 365/233.1; 365/230.01

(58) Field of Classification Search ............ 365/189.04, 365/230.03, 230.06, 230.01
See application file for complete search history.

(56) References Cited

U.S. PATENT DOCUMENTS

| 6,360,285 B1 | 3/2002 | Fenwick et al. |
| 2003/0227800 A1* | 12/2003 | Saito et al. ............... 365/200 |
| 2004/0133730 A1 | 7/2004 | Harrand et al. |
| 2004/0190363 A1 | 9/2004 | Shigenami et al. |

FOREIGN PATENT DOCUMENTS

JP    11-283364 A    10/1999

* cited by examiner

*Primary Examiner*—Thong Q Le
(74) *Attorney, Agent, or Firm*—Arent Fox LLP

(57) ABSTRACT

A memory system includes a semiconductor memory having a plurality of banks; and a controller accessing the semiconductor memory. The number of the banks is larger than the number of banks simultaneously accessed. When receiving an access command for the bank currently executing the access operation, the semiconductor memory activates a busy signal and keeps the busy signal active until the access operation currently executed is completed. The controller stops outputting a next access command while receiving the activated busy signal. Based on the received busy signal, the controller judges whether or not the next access command should be outputted to the semiconductor memory. Consequently, it is possible to easily execute the random access in a semiconductor memory having a plurality of banks, without giving any load to the system side, which can improve the data transfer rate at the time of the random access.

19 Claims, 20 Drawing Sheets

SEMICONDUCTOR MEMORY, MEMORY SYSTEM, AND OPERATION METHOD OF MEMORY SYSTEM

CROSS REFERENCE TO RELATED APPLICATION

This application is based upon and claims the benefit of priority from Japanese Patent Application No. 2006-074533, filed on Mar. 17, 2006, the entire contents of which are incorporated herein by reference.

BACKGROUND OF THE INVENTION

1. Field of the Invention

The present invention relates to a semiconductor memory having a plurality of banks and to a memory system having this semiconductor memory and a controller.

2. Description of the Related Art

In recent years, the data volume handled by a system apparatus such as a mobile phone has dramatically increased. In accordance therewith, the capacity of a semiconductor memory mounted on the system apparatus has also increased, which has created a demand for a semiconductor memory with a high data transfer rate. A semiconductor memory such as a DRAM having a plurality of banks improves its data transfer rate by operating the banks simultaneously to sequentially read data from the banks. An access cycle of the semiconductor memory for executing a read operation or a write operation once depends on the operation time of a memory core. Therefore, the data transfer rate increases when sequential accesses continue, but it decreases when random accesses frequently occur because data output is interrupted. In order to prevent the data transfer rate from lowering, it is needed to determine, at a development stage of a system, data to be held in the respective banks so that sequential accesses continue. That is, in the prior art, in order to prevent the data transfer rate from lowering, the system side has to be designed so as not to continuously access the same bank.

For example, Japanese Unexamined Patent Application Publication No. Hei 11-283364 describes a technique for comparing a row address currently accessed with an externally supplied new row address and determining that it is in a hit state when these row addresses are the same and that it is in a mistake state when these row addresses are different. This allows a controller accessing a semiconductor memory to use a DRAM as if it is a cache memory.

However, in the technique described in Japanese Unexamined Patent Application Publication No. Hei 11-283364, the data transfer rate lowers since the mistake state frequently occurs when random accesses continue. In order to improve the data transfer rate, it is necessary for the system side to cleverly determine the access order or the like of the semiconductor memory.

As described above, the access cycle of the semiconductor memory depends on the operation time of the memory core. Therefore, even heightening the frequency of clocks cannot improve the data transfer rate at the time of the random access. Thus, there has been no proposal of a method to improve the data transfer rate at the time of the random access without giving any load to the system side.

SUMMARY OF THE INVENTION

It is an object of the present invention to easily execute the random access in a semiconductor memory having a plurality of banks and in a memory system having this semiconductor memory and a controller, without giving any load to the system side. It is another object of the present invention to improve the data transfer rate at the time of the random access without giving any load to the system side.

A memory system includes a semiconductor memory having a plurality of banks operable independently from each other, and a controller accessing the semiconductor memory. The semiconductor memory includes a bank control unit controlling access operations to the banks; an address hold unit holding a bank address indicating a bank currently in the access operation; an address comparison unit; and a comparison result output unit. A number of the banks is larger than a number of banks simultaneously accessible by the bank control unit. The address comparison unit compares the bank address held by the address hold unit with a bank address included in an external address which is supplied together with an access request from an exterior. The comparison result output unit keeps activating a busy signal while a result of the comparison by the address comparison unit indicates coincidence. Consequently, when receiving an access command for the bank currently in the access operation, the semiconductor memory activates the busy signal and keeps activating it until the access operation currently executed is completed.

The controller has an access control unit and a comparison result receiving unit. The access control unit outputs an access command for accessing the semiconductor memory, the external address, and write data and receives read data from the semiconductor memory. While the comparison result receiving unit is receiving the activated busy signal, the access control unit stops outputting a next access command, a next external address, and next write data and stops receiving the read data. That is, while receiving the activated busy signal, the controller stops outputting a next access command to the semiconductor memory. Being notified by the busy signal, the controller can judge whether or not the next access command should be outputted to the semiconductor memory. This eliminates the need for working in advance on allocating data to be stored in the semiconductor memory to the plural banks. As a result, it is possible to easily execute the random access without giving any load to the system. At this time, the number of the banks is set larger than the number of banks simultaneously accessed, which can increase the number of banks in non-operation. This makes it possible to decrease the probability that the busy signal is activated at the time of the random access. As a result, the data transfer rate at the random access can be improved.

In the present invention, it is possible to easily execute the random access without giving any load to the system side. Further, it is possible to improve the data transfer rate at the time of the random access without giving any load to the system side.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
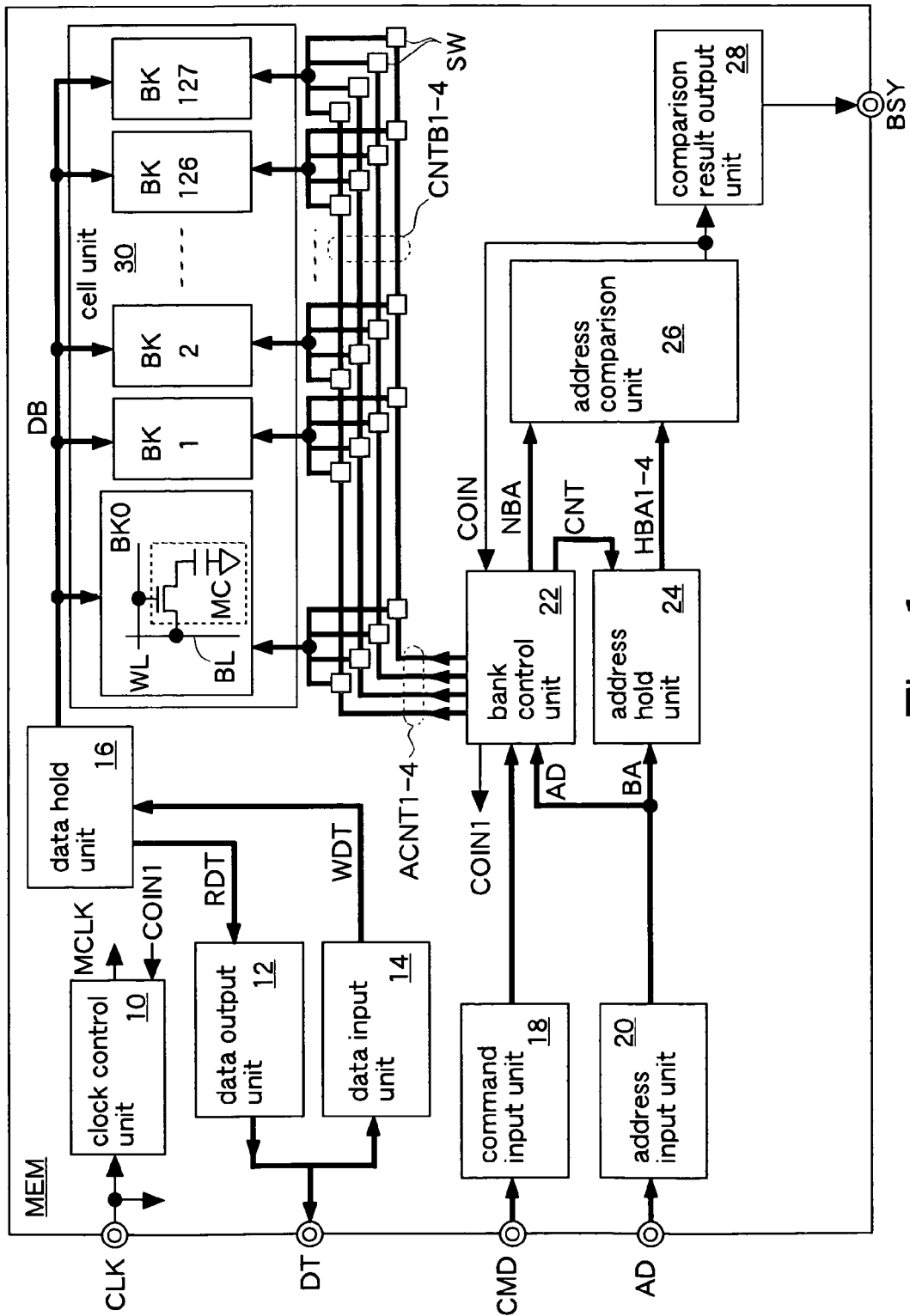
FIG. 1 is a block diagram showing a semiconductor memory of a first embodiment in the present invention.

Preferred embodiments of the invention will now be described with reference to the accompanying drawings. In the drawings, a bold signal line denotes a plurality of signal lines. A part of a block connected to a bold line is composed of a plurality of circuits. A signal line through which a signal is transferred is denoted by a symbol equal to the name of the signal. Double circles in the drawings denote an external terminal.

FIG. 1 shows a semiconductor memory of a first embodiment in the present invention. A semiconductor memory MEM is, for example, a clock synchronous type DRAM (for example, a SDRAM). The memory MEM includes a clock control unit 10, a data output unit 12, a data input unit 14, a data hold unit 16, a command input unit 18, an address input unit 20, a bank control unit 22, an address hold unit 24, an address comparison unit 26, a comparison result output unit 28, and a cell unit 30 including 128 banks BK (BK0-BK127). Note that the memory MEM and a later-described controller CNTL constitute a memory system.

The clock control unit 10 generates an internal clock MCLK in synchronization with an external clock CLK while a coincidence signal COIN1 is inactive, and stops generating the internal clock MCLK while the coincidence signal COIN1 is active. The internal clock MCLK is supplied to the data output unit 12, the data input unit 14, the command input unit 18, and the address input unit 20 to be used for operating these circuits. The external clock CLK is supplied to the bank control unit 22, the address hold unit 24, the address comparison unit 26, the address result output unit 28, and the cell unit 30 to be used for operating these circuits. The external clock CLK is a system clock controlling the operation of a system LSI shown in FIG. 4 to be described later.

The data output unit 12 outputs read data RDT, which is outputted from the data hold unit 16, to a data terminal DT in synchronization with the internal clock MCLK. The data input unit 14 receives write data WDT supplied to the data terminal DT, in synchronization with the internal clock MCLK to output the received data to the data hold unit 16. The data terminal DT is a terminal common to the read data RDT and the write data WDT and is composed of, for example, 8 bits. The data hold unit 16 holds a plurality of sets of the read data RDT that are sequentially read from the cell unit 30 via a data bus DB, and holds a plurality of sets of the write data WDT which are to be written sequentially to the cell unit 30 via the data bus DB.

The command input unit 18 receives an access command CMD supplied to a command terminal CMD, in synchronization with the internal clock MCLK to output the received access command CMD to the bank control unit 22. In this embodiment, a read command, a write command, and a refresh command are supplied as the access command CMD to the command input unit 18. The address input unit 20 receives an external address AD supplied to an address terminal AD, in synchronization with the internal clock MCLK to output the received external address AD to the bank control unit 22 and the address hold unit 24. The external address AD is composed of a 7-bit bank address BA (high-order address) for selecting a bank BK and an address (low-order address) for selecting a memory cell in the bank BK. A row address for selecting a word line WL in each of the banks BK and a column address for selecting a bit line BL therein are simultaneously supplied as the low-order address to the memory MEM.

The bank control unit 22 has a function of simultaneously and independently accessing arbitrary four banks BK out of the banks BK0-127 of the cell unit 30. Therefore, the bank control unit 22 outputs four access control signals ACNT1-4 independent from one another. Each of the access control signals ACNT1-4 is composed of: timing signals for an access operation to the bank BK, such as a word line control signal, a sense amplifier control signal, a column control signal, and a precharge control signal; and an address signal for selecting a memory cell in each of the banks BK. The number of the access control signals ACNT1-4 is equal to an access cycle number that is a clock cycle number (=4) representing a period from the receipt of an access request by the memory MEM up to the completion of the execution of one access operation. Setting the number of the access control signals ACNT1-4 outputted by the bank control unit 22 equal to the access cycle number makes it possible to reduce the circuit scale of the bank control unit 22 to a minimum, resulting in a reduced chip size of the memory MEM. Note that in the present invention, the number of the access control signals ACNT1-4 may be any providing that it is equal to or larger than the access cycle number and is smaller than the number of the banks BK.

The bank control unit 22 receives the command CMD, the address AD including the bank address BA, and a coincidence signal COIN and outputs the coincidence signal COIN1, a next bank address NBA indicating a bank BK in which the access operation is to be executed next, and a control signal CNT for controlling the operation of the address hold unit 24. The coincidence signal COIN1 is outputted in synchronization with the coincidence signal COIN. The bank control unit 22 not only controls the operations of the banks BK but also controls the operations of the data output unit 12, the data input unit 14, the data hold unit 16, and the command input unit 18. The bank control unit 22 will be described in detail in FIG. 2 to be described later.

The address hold unit 24 holds a maximum of four bank addresses BA indicating the banks BK currently executing the access operation (a read operation, a write operation, or a refresh operation accompanying an external refresh request). The holdable number is set equal to the access cycle number (=4) as will be described in FIG. 3 to be described later. This number is equal to the number of the banks BK capable of simultaneously executing the access operations. Therefore, the address hold unit 24 can hold all the bank addresses BA currently executing the access operations. The address hold unit 24 outputs the bank addresses BA that it holds, as held bank addresses HBA1-4. By setting the number of the bank addresses BA holdable by the address hold unit 24 equal to the access cycle number, it is possible to reduce the circuit scale of the address hold unit 24 to a minimum, resulting in a reduced chip size of the memory MEM. Note that the bank addresses BA in number exceeding the access cycle number may be held in the address hold unit 24.

The address comparison unit 26 activates the coincidence signal COIN when the bank address BA (=HBA) supplied together with the access command CMD coincides with any one of the held bank addresses HBA1-4. The comparison result output unit 28 activates a busy signal BSY in synchronization with the activation of the coincidence signal COIN. For example, activation level of the coincidence signal COIN and the busy signal BSY is low-logic level (ground voltage), and inactivation level of the coincidence signal COIN and the busy signal BSY is high-logic level (power supply voltage).

The cell unit 30 has the 128 banks BK0-127 as described above. Each of the banks BK0-127 has dynamic memory cells MC, and word lines WL and bit lines BL which are connected to the memory cells MC. Each of the banks BK0-127 has a word driver, a sense amplifier, a precharge circuit, and so on so as to operate independently from one another. The banks BK0-127 are connected via switch parts SW to control signal buses CNTB1-4 through which the access control signals ACNT1-4 are transferred.

The number of the control signal buses CNTB1-4 is equal to the access cycle number. By setting the number of the control signal buses CNTB1-4 equal to the access cycle number, it is possible to reduce a wiring area of the control signal buses CNTB1-4 to a minimum, resulting in a reduced chip size of the memory MEM. Note that in the present invention, the number of the control signal buses CNTB may be any providing that it is equal to or larger than the access cycle number and is smaller than the number of the banks BK. The operations of the switch parts SW are controlled by the bank control unit 22. One of the switch parts SW in each of the control signal busses CNTB1-4 turns on, so that the four banks BK are simultaneously accessible. For example, the read operation of the banks BK0, BK127, the write operation of the banks BK1, and the refresh operation of the bank BK126 are simultaneously executable.

Figure 6:
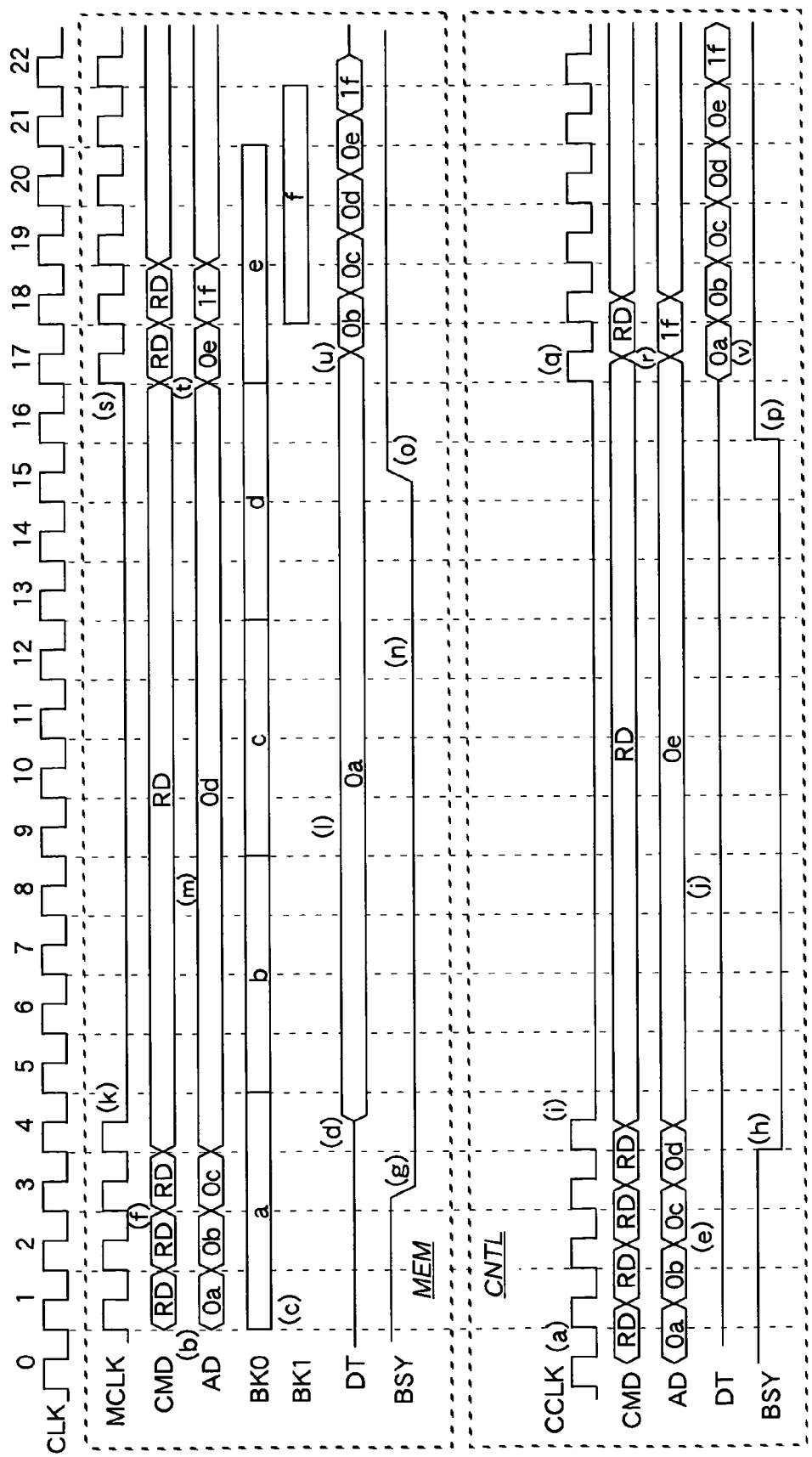
FIG. 6 is a timing diagram of showing an example of an operation of the memory system according to the first embodiment.
Figure 9:
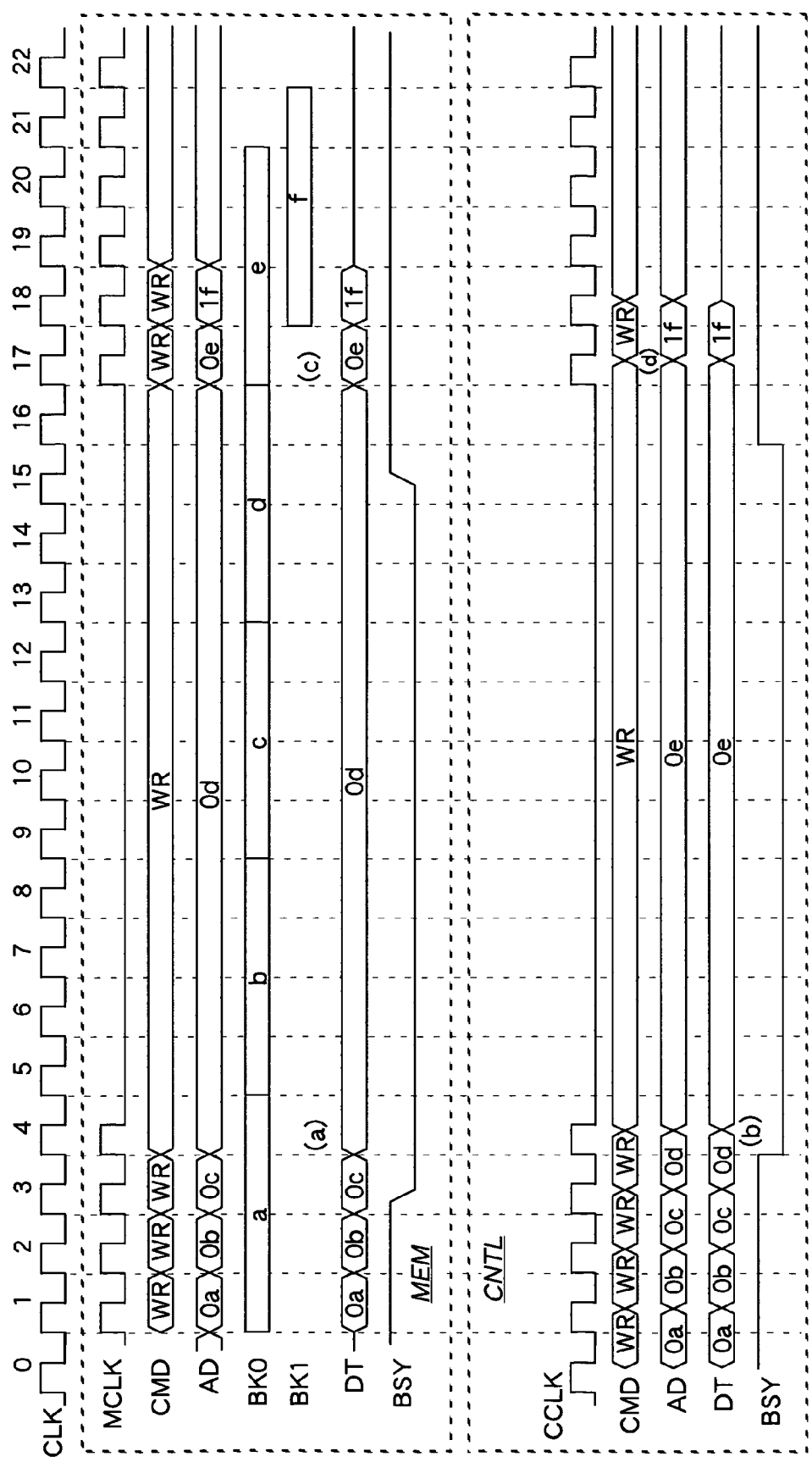
FIG. 9 is a timing diagram of showing another example of an operation of the memory system according to the first embodiment.

Every time it receives the read command RD (access request), the memory MEM reads data (8 bits) from the bank BK selected according to the address AD to output the read data to the data terminal DT once, as shown in FIG. 6 to be described later. Further, every time it receives the write command WR (access request), the memory MEM receives write data (8 bits) at the data terminal DT once to write the received write data DT to the bank BK selected according to the address AD, as shown in FIG. 9 to be described later. Thus, the memory MEM is designed with operation specifications so that data is inputted/outputted once in response to each access request, and therefore, is accessed with interface specifications similar to those of a SRAM. This allows the controller to random-access the memory MEM easily.

A period during which each of the banks BK0-127 executes the access operation (access cycle) is 4 clock cycles as described above. Therefore, the maximum number of the banks BK simultaneously executing the access operation is "4". Further, in this embodiment, the number of the banks BK is 128. In this case, the probability that an arbitrary bank BK is accessible (probability that random access is allowed) is 100% (128/128) when none of the banks BK is executing the access operation, 99.2% (127/128) when one of the banks BK is executing the access operation, 98.4% (126/128) when two of the banks BK are executing the access operations, and 97.6% (125/128) when three of the banks BK are executing the access operations. Therefore, in this embodiment, the probability that four continuous access operations can be random accesses is a value equal to a product of these percentages (95.4%).

The random-access probability increases as the number of the banks BK increases, and decreases as the number of the banks BK decreases. Further, the random-access probability increases as the access cycle number decreases, and decreases as the access cycle number increases. The access cycle number is smaller as the frequency of the clock CLK is lower. In general, the probability that a semiconductor memory having a plurality of banks BK is random-accessible can be found by Expression (1) representing permutation. In the expression, "a" is the access cycle number and "n" is the number of the banks BK (2 or more).

$$nPa/n^a \qquad (1)$$

Figure 2:
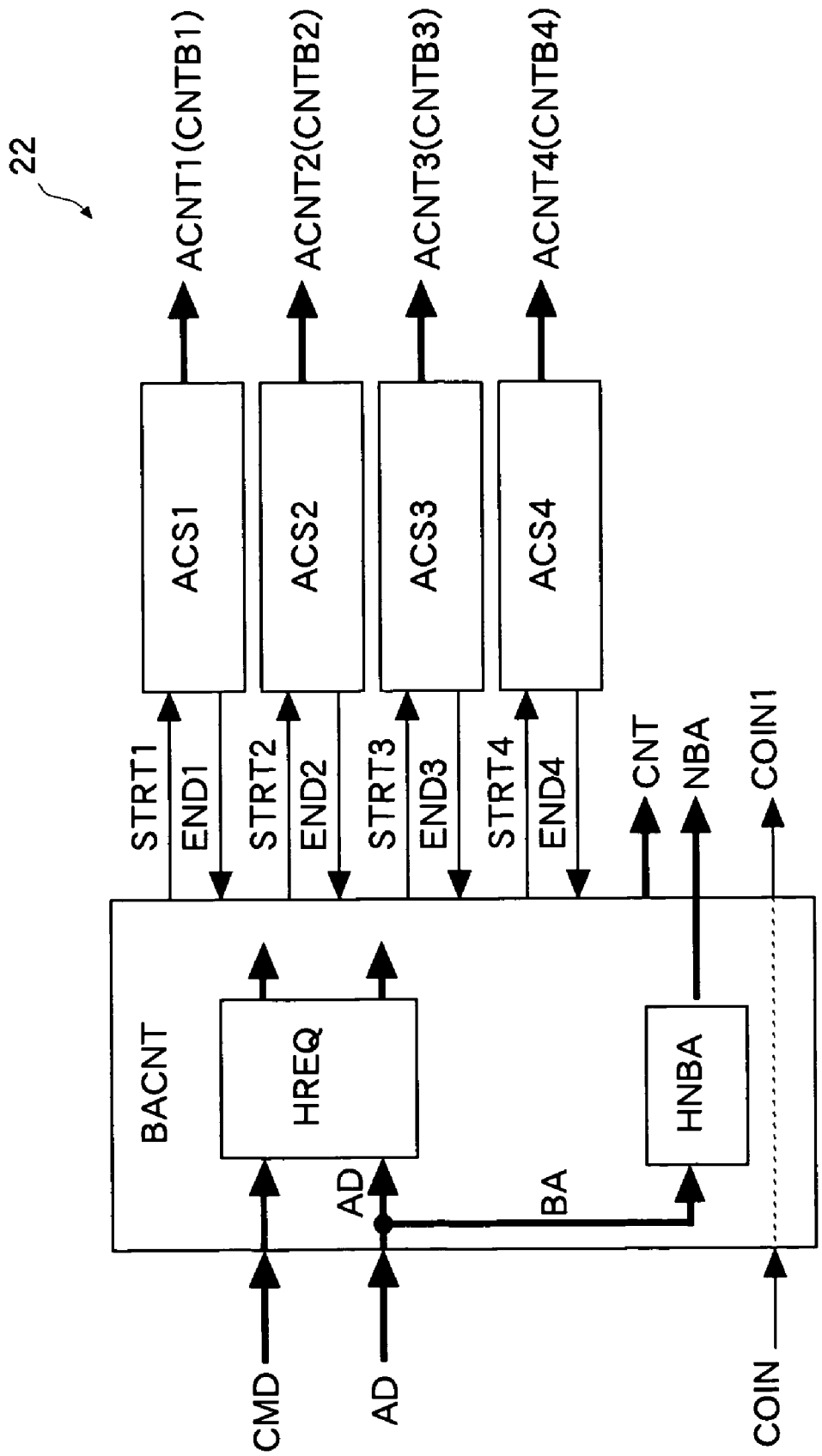
FIG. 2 is a block diagram showing the details of the bank control unit shown in FIG. 1.

FIG. 2 shows the details of the bank control unit 22 shown in FIG. 1. The bank control unit 22 has a bank control circuit BACNT and four access control circuits ASC1-4. The bank control unit 22 has, in addition to the circuits shown in the drawing, a control circuit controlling the operations of the data output unit 12, the data input unit 14, the data hold unit 16, and the command input unit 18.

A bank address hold circuit HNBA of the bank control circuit BACNT outputs the bank address BA whose corresponding access operation is executed next, as a next bank address NBA. When receiving the access request (CMD, AD), the bank control circuit BACNT selects which one of the control signal buses CNTB1-4 is to be used, and outputs an access start signal STRT (one of STRT1-4) together with the access request (CMD, AD) to the access control circuit ACS (one of ACS1-4) corresponding to the selected control signal bus CNTB. In a case where the bank BK corresponding to the access request is in the course of the access operation (in a case where the coincidence signal COIN is activated), the bank control circuit BACNT temporarily holds the newly received access request and address AD in a hold circuit HREQ and outputs the access start signal STRT after the operation of the access control circuit ACS controlling the access of this bank BK is ended. Consequently, in a case where the execution of the access operation is reserved, the access request and the address AD can be surely held. The end of the operation of the access control circuits ACS is notified to the bank control circuit BACNT by access end signals END1-4.

The hold circuit HREQ temporarily holds the access requests in order in which they are received. Consequently, when the plural access requests for the same bank BK are continuously received and thereafter an access request for another bank BK is received, it is possible to prevent the access operation of the other bank BK from being executed first. That is, a malfunction of the memory MEM can be prevented.

The access control circuits ACS1-4 output the access control signals ACNT1-4 in response to the access start signals STRT1-4 respectively, and output the access end signals END1-4 in response to the end of the access operations respectively. The access control circuits ACS1-4 operate independently from one another and are operable simultaneously. The number of the access control circuits ACS1-4 is equal to the access cycle number. Setting the number of the access control circuits ACS1-4 equal to the access cycle number makes it possible to reduce the circuit scale of the access control circuits ACS1-4 to a minimum, resulting in a reduced chip size of the memory MEM. Note that in the present invention, the number of the access control circuits ACS may be any providing that it is equal to or larger than the access cycle number and is smaller than the number of the banks BK.

Figure 3:
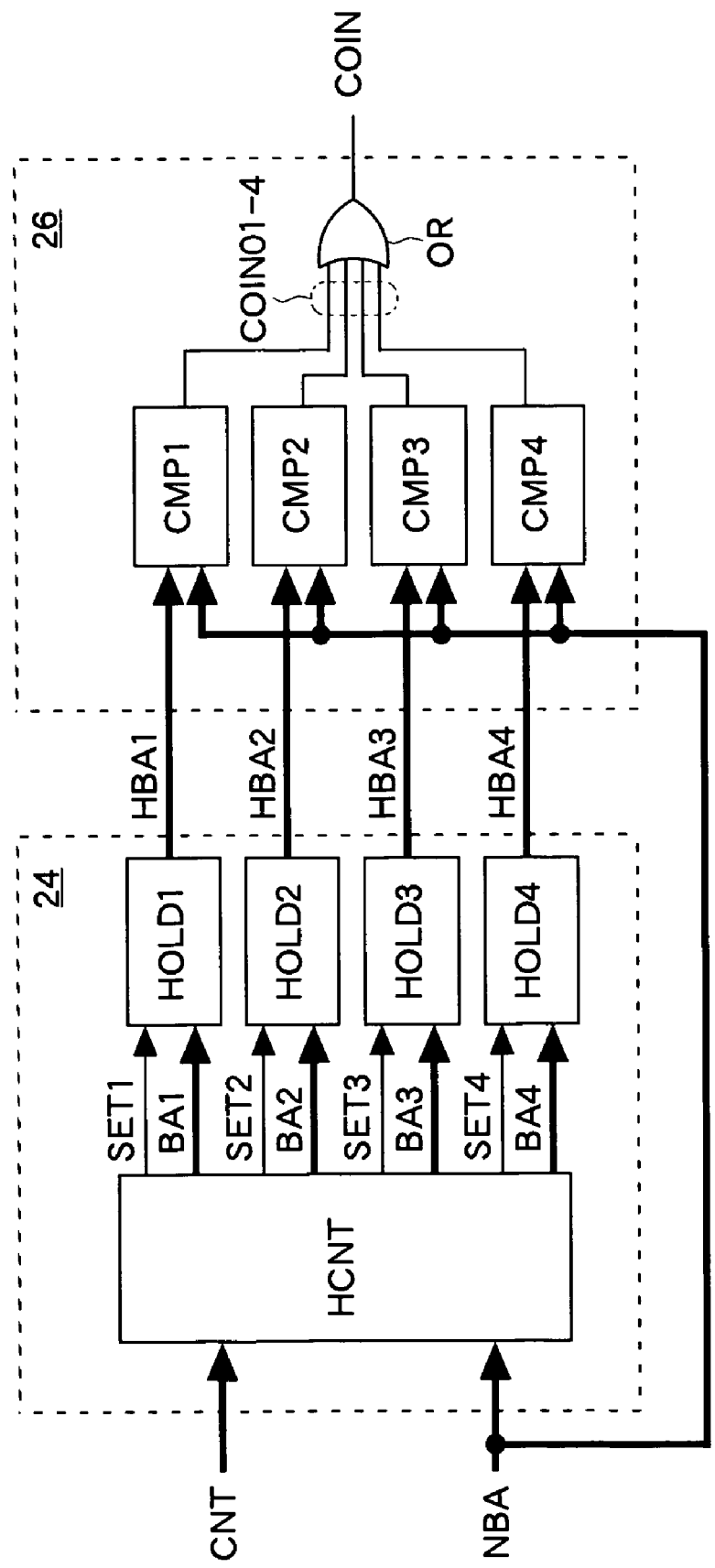
FIG. 3 is a block diagram showing the details of the address hold unit and the address comparison unit shown in FIG. 1.

FIG. 3 shows the details of the address hold unit 24 and the address comparison unit 26 shown in FIG. 1. The address hold unit 24 has a hold control circuit HCNT and four hold circuits HOLD (HOLD1-4). The hold control circuit HCNT selects the hold circuit HOLD (one of HOLD1-4) that is to hold the bank address NBA, according to the control signal CNT outputted from the bank control unit 22 and then outputs the bank address (one of BA1-4) and a set signal SET (one of SET1-4) to the selected hold circuit HOLD.

Each of the hold circuits HOLD has a register constituted of 8 bits, low-order 7 bits of which hold the bank address NBA. The uppermost bit in a set state indicates that the held bank address NBA is effective and the uppermost bit in a reset state indicates that the held bank address NBA is invalid. Each of the hold circuits HOLD holds the bank address NBA in synchronization with the activation of the set signal SET to set the uppermost bit in order to make the held bank address NBA effective. Further, each of the hold circuits HOLD resets the uppermost bit in order to make the bank address NBA, which has been held, invalid. The hold circuit HOLD outputs the bank address NBA that is held, as a held bank address HBA (one of HBA1-4) together with the uppermost bit.

The address comparison unit 26 has four comparators CMP1-4 and an OR circuit. Each of the comparators CMP1-4 receives the bank address NBA and the corresponding held bank address HBA (one of HBA1-4). Each of the comparators CMP1-4 compares the held bank address HBA and the bank address NBA when the uppermost bit of the held bank address HBA is in a set state. Each of the comparators CMP1-4 activates the coincidence signal COIN (one of COIN01-COIN04) to high-logic level when the comparison result indicates coincidence, that is, when the bank BK corresponding to the access request is the same as the bank BK that is in access operation. The comparators CMP1-4 inactivate the coincidence signals COIN01-COIN04 to low-logic level respectively when the uppermost bits of the held bank addresses HBA are in a reset state. The OR circuit OR- operates the coincidence signals COIN01-COIN04 to output the operation result as the coincidence signal COIN.

The number of the hold circuits HOLD and the number of the comparators CMP are equal to the access cycle number. Setting the number of the hold circuits HOLD and the number of the comparators CMP equal to the access cycle number makes it possible to reduce the circuit scale of the hold circuits HOLD and the comparators CMP to a minimum, resulting in a reduced chip size of the memory MEM. Note that in the present invention, the number of the hold circuits HOLD and the number of the comparators CMP may be any providing that they are equal to or larger than the access cycle number and are smaller than the number of the banks BK.

Figure 4:
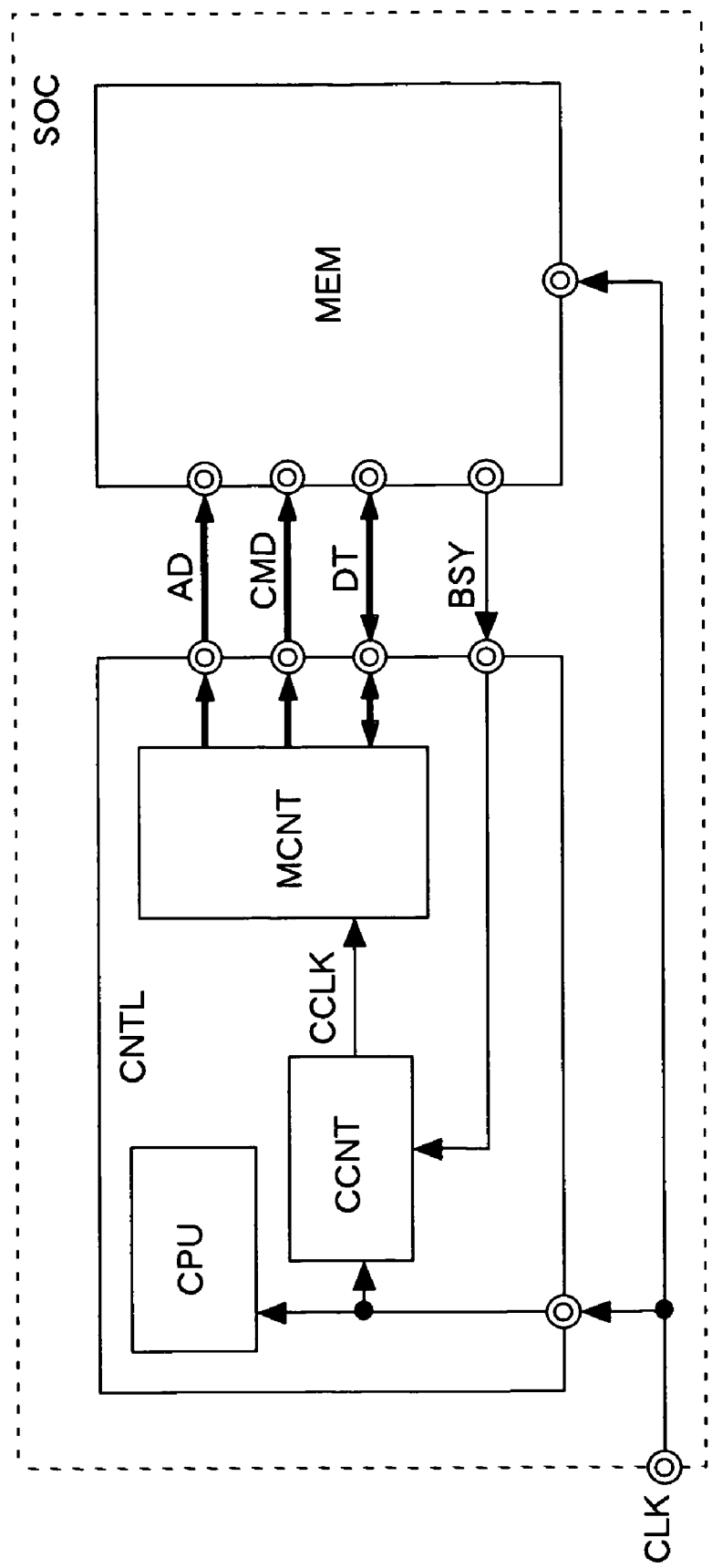
FIG. 4 is a block diagram showing an overview of the memory system according to the first embodiment.

FIG. 4 shows an overview of the memory system according to the first embodiment. In this embodiment, the memory system is formed as a system LSI (SOC; System On Chip) integrated on a silicon substrate. The SOC has the semiconductor memory shown in FIG. 1 and the controller CNTL accessing the semiconductor memory MEM. The controller CNTL has a CPU, a clock control unit CCNT (comparison result receiving unit), and a memory control unit MCNT (access control unit). The CPU controls the operation of the whole system. The clock control unit CCNT receives the busy signal BSY, and outputs the external clock CLK as an internal clock CCLK while the busy signal BSY is inactive (high-logic level). Further, the clock control unit CCNT stops generating the internal clock CCLK while the busy signal BSY is active (low-logic level).

The memory control unit MCNT operates in synchronization with the internal clock CCLK, and in order to access the memory MEM according to a command from the CPU, it outputs the access command CMD, the external address AD, and the write data DT and receives the read data DT from the memory MEM. The internal clock CCLK is not generated while the clock control unit CCNT is receiving the activated busy signal BSY. During this period, the memory control unit MCNT does not operate and its state is kept unchanged from an instant when the generation of the internal clock CCLK stops. That is, the memory control unit MCNT stops outputting a next access command CMD, a next external address AD, and next write data DT and stops receiving the read data DT.

Figure 5:
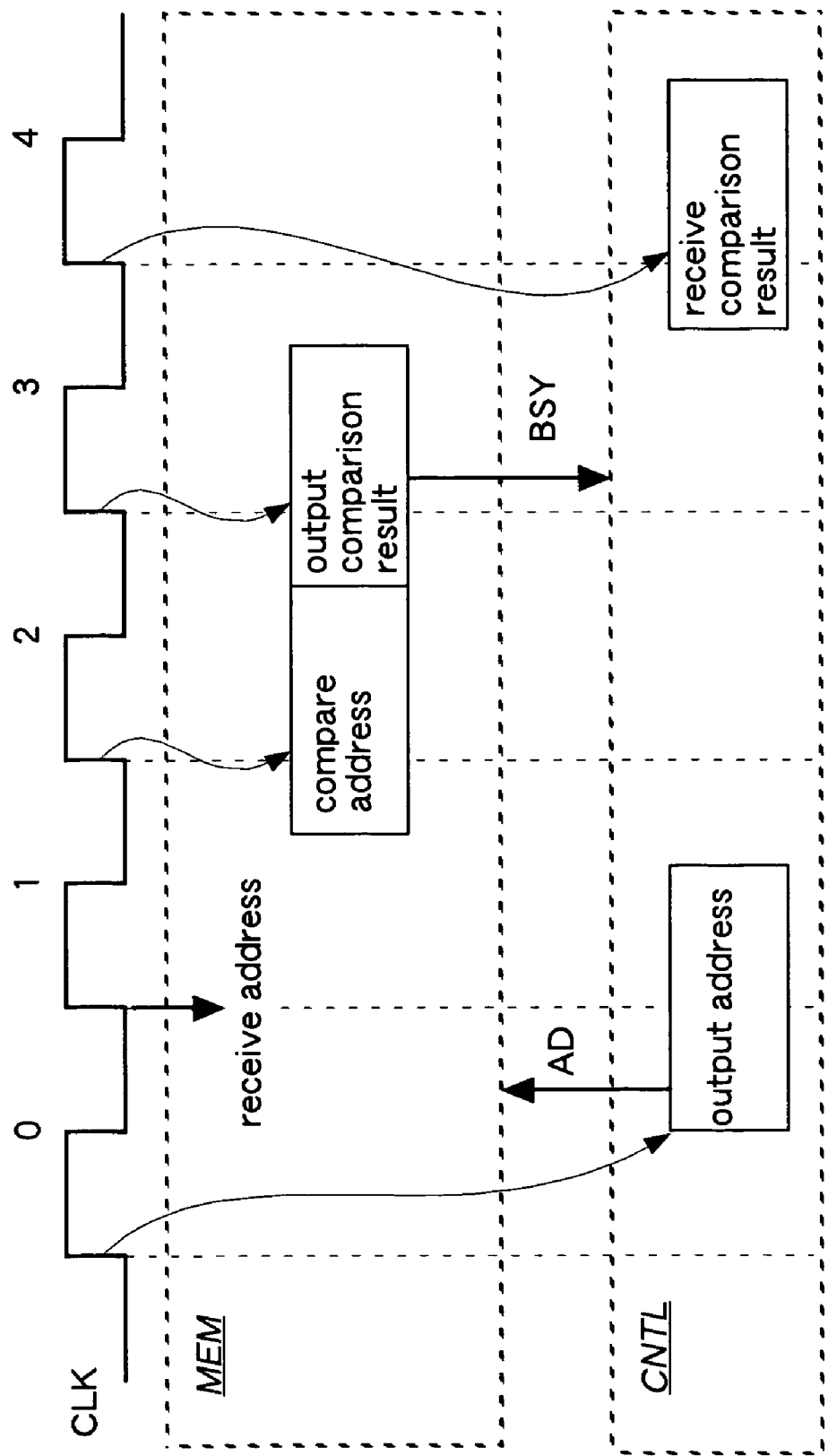
FIG. 5 is a timing diagram showing an overview of the semiconductor memory and the controller shown in FIG. 4.

FIG. 5 shows an overview of the operations of the memory MEM and the controller CNTL shown in FIG. 4. When accessing the memory MEM, the controller CNTL outputs the address AD in synchronization with a rising edge of the 0th clock signal CLK (a third timing). At this time, the access command CMD is also outputted. The memory MEM receives the address AD and the access command CMD in synchronization with a rising edge of the 1st clock CLK. The address comparison unit 26 (FIG. 3) of the memory MEM compares the held bank address HBA and the bank address BA in synchronization with a rising edge of the 2nd clock CLK (a first timing) which is one clock cycle (a first time) later.

In a case where the comparison result indicates coincidence, the comparison result output unit 28 outputs the busy signal BSY in synchronization with a rising edge of the 3rd clock CLK (a second timing). In other words, the busy signal BSY is outputted 2 clocks later after the address AD is received. The controller CNTL receives the busy signal BSY in synchronization with a rising edge of the 4th clock CLK (a fourth timing). The operation shown in FIG. 5 is executed in synchronization with the clock CLK, so that the timing design of the memory MEM and the controller CNTL can be facilitated. This ensures the operation of the memory system, so that reliability of the memory system can be improved.

FIG. 6 shows an example of the operation of the memory system according to the first embodiment. In this example, the controller CNTL supplies a read command RD to the memory MEM six consecutive times. The first five read commands RD are requests for the bank BK0, and the last read command RD is a request for the bank BK1. The numerals in the waveforms of the address AD represent the numbers of the banks BK, and the alphabetical letters represent the positions of the word lines WL. The square frames of the banks BK0-1 represent operating periods of the banks BK0-1. Note that a refresh command may be supplied in place of any of the read commands RD. The operation in this case is the same as a read access operation except that read data DT is not outputted during a refresh operation (access operation) corresponding to the refresh command. A refresh request may be supplied also in FIG. 7, FIG. 8, and FIG. 12 to be described later. As described above, every time it receives the read command RD, the memory MEM accesses one of the banks BK (access request) to output the data DT (8 bits) read from the bank BK, to the controller CNTL once.

In this embodiment, the controller CNTL simultaneously outputs each access command CMD (=RD) and a corresponding address AD in synchronization with a rising edge of a clock CLK (CCLK). The memory MEM receives the access command CMD (=RD) and the corresponding address AD in synchronization with a rising edge of a next clock CLK (MCLK).

First, the controller CNTL outputs the first access request (the read command RD and address AD (0a)) (FIG. 6(a)). The memory MEM receives the first read command RD and address AD (0a) in synchronization with the first clock CLK (MCLK) (FIG. 6(b)). The bank control circuit BACNT shown in FIG. 2 outputs, for example, an access start signal STRT1 after recognizing that the bank BK0 is in an idle state, to start a read access operation of the bank BK0 (FIG. 6(c)). The idle state is recognized when it receives the access end signal END corresponding to the access start signal STRT from the access control circuit ACS. The address hold unit 24 shown in FIG. 3 holds the bank address (BK0) in, for example, the hold circuit HOLD1 according to the control signal CNT outputted from the bank control unit 22.

The bank BK0 starts outputting read data DT (0a) in synchronization with a falling edge of the fourth clock cycle (FIG. 6(d)). That is, in this memory MEM, the clock cycle number (read latency) from the receipt of the read command RD to the output of the read data DT is "4". Then, the bank BK0 finishes the read access operation before the fifth clock MCLK rises. Thus, the memory MEM requires four clock cycles for executing the read operation once. That is, the read access cycle of the memory MEM is 4 clock cycles.

The controller CNTL sequentially outputs the second to fourth access requests (RD, AD (0b, 0c, 0d)) (FIG. 6(e)). The memory MEM sequentially receives the access requests (RD, AD (0b, 0c, 0d)) in synchronization with the second to fourth clocks MCLK (FIG. 6(f)). The access requests are temporarily held in the hold circuit HREQ of the bank control circuit BACNT. The hold circuit HREQ holds the access requests until the bank control circuit BACNT outputs the access start signals STRT1 corresponding to the respective access requests. The address comparison unit 26 shown in FIG. 3 detects that the held bank address HBA1 (BK0) outputted from the hold circuit HOLD1 and newly supplied bank addresses BA (BK0) coincide with each other and activates the coincidence signal COIN.

In response to the activation of the coincidence signal COIN, the comparison result output unit 28 shown in FIG. 1 activates the busy signal BSY to low level in synchronization with a rising edge of the third clock MCLK (FIG. 6(g)). In response to the activation of the coincidence signal COIN, the bank control circuit BACNT judges that the received access requests are for the bank BK0 currently executing the access operation. The bank control circuit BACNT outputs the coincidence signal COIN1 in response to the coincidence signal COIN.

When not holding a next access request for a bank BK currently executing an access operation, the bank control circuit BACNT invalidates an address of the bank BK held in the address hold unit 24. For example, the invalidating timing is a rising edge of the third clock CLK in 4 clock cycles which is an execution period of the access operation. On the other hand, when holding a new access request for the bank BK currently executing the access operation, the bank control circuit BACNT keeps the address of the bank BK held in the address hold unit 24 effective. In this example, since the four read commands RD for the bank BK0 are consecutively supplied, the address of the bank BK0 held in the address hold unit 24 is not invalidated until a rising edge of the 15th clock CLK.

The controller CNTL receives the activation of the busy signal BSY in synchronization with a rising edge of the fourth clock CCLK (FIG. 6(h)). The clock control unit CCNT of the controller CNTL shown in FIG. 4 stops generating the internal clock CCLK in response to the activation of the busy signal BSY (FIG. 6(i)). While the internal clock CLK is stopped, the operation of the memory control unit MCNT of the controller CNTL is held. Consequently, the output of a new command CMD and a new address AD is stopped, and the fifth read command RD and address AD (0e) are kept outputted (FIG. 6(j)).

Meanwhile, in the memory MEM, the clock control unit 10 shown in FIG. 1 stops generating the internal clock MCLK in response to the activation of the coincidence signal COIN1 (FIG. 6(k)). While the internal clock MCLK is stopped, the operations of the data output unit 12, the data input unit 14, the command input unit 18, and the address input unit 20 of the memory MEM are held. Concretely, the data output unit 12 keeps outputting the read data DT (0a) (FIG. 6(l)). This facilitates the control on the controller CNTL side as will be described later. The command input unit 18 and the address input unit 20 stop receiving a new command CMD and a new address AD and keeps holding the already received read command RD and address AD (0d) (FIG. 6(m)). Stopping the receipt of the new command CMD and address AD makes it possible to prevent the supply of an unjustified command CMD and address AD to the memory MEM, which can prevent a malfunction of the memory MEM.

The bank control unit 22 and the banks BK operate in synchronization with the clock CLK, so that they continue their operations even when the internal clock MCLK is stopped. The address comparison unit 26 keeps the coincidence signal COIN active until read access operations for the bank BK0 corresponding to the addresses AD (0b, 0c) are completed and a read access operation for the bank BK0 corresponding to the address AD (0d) is executed. Consequently, the comparison result output unit 28 keeps the busy signal BSY active (FIG. 6(n)).

After the read access operation (d of BK0) corresponding to the fourth read command RD is started, the bank control unit 22 judges that there remains no access operation for the bank BK0 that has not been executed. Based on this judgment, the hold control circuit HCNT of the address hold unit 24 shown in FIG. 3 invalidates the bank address BA indicating the bank BK0. The address comparison unit 26 inactivates the coincidence signal COIN since there remains no held bank address HBA for comparison. In response to the inactivation of the coincidence signal COIN, the coincidence signal COIN1 is inactivated and the busy signal BSY is inactivated to high level in synchronization with the 15th clock CLK (FIG. 6(o)).

The controller CNTL receives the inactivation of the busy signal BSY in synchronization with the 16th clock CLK (FIG. 6(p)). The clock control unit CCNT shown in FIG. 4 restarts the generation of the 17th clock CCLK and subsequent clocks CCLK in response to the inactivation of the busy signal BSY (FIG. 6(q)). Consequently, the memory control unit MCNT of the controller CNTL restarts the receipt operation of data DT and restarts the output operation of a command CMD and an address AD. Concretely, the memory control unit MCNT receives the read data DT (0a) and outputs an address AD (1f) corresponding to the sixth read command RD (FIG. 6(r)).

Meanwhile, in the memory MEM, the clock control unit 10 restarts the generation of the internal clock MCLK in response to the inactivation of the coincidence signal COIN 1 (FIG. 6(s)). Consequently, the memory MEM restarts the receipt operation of a command CMD and an address AD and restarts the output operation of data DT. Concretely, the command input unit 18 and the address input unit 20 of the memory MEM sequentially receive the two consecutive read commands RD and addresses AD (0e, 1f) in synchronization with the clock MCLK (FIG. 6(t)).

When the addresses AD (0e, 1f) are supplied, there exists no bank BK executing an access operation, and therefore, the comparison result of the addresses HBA, BA indicates the non-coincidence. That is, the coincidence signal COIN is not activated. Therefore, the bank control unit 22 sequentially starts read operations for the banks BK0, BK1. Since the read operation is immediately started when the comparison result indicates the non-coincidence, it is possible to reduce the read access cycle to a minimum. The data output unit 12 of the memory MEM sequentially outputs read data DT (0b, 0c, 0d, 0e, 1f) in synchronization with the 18th to 22nd clocks MCLK (FIG. 6(u)).

The address hold unit 24 holds the bank address (BK0) in, for example, the hold circuit HOLD1 according to the control signal CNT that is supplied from the bank control unit 22 in response to the read command RD (0e). Further, the address hold unit 24 holds the bank address (BK1) in, for example, the hold circuit HOLD2 according to the control signal CNT that is supplied from the bank control unit 22 in response to the read command RD (0f). Since the bank addresses are different from each other, the busy signal BSY is not activated.

In the waveforms in FIG. 6, the read operation appears to be delayed since the clock MCLK is stopped halfway. However, every read data DT is outputted after the elapse of four clocks (read latency="4") of the clock MCLK from the supply of the read commands RD.

The controller CNTL sequentially receives the read data DT from the memory MEM in synchronization with the 17th to 22nd clocks CCLK (FIG. 6(v)). The memory MEM continues outputting the read data DT (0a) even while the clock MCLK is stopped. Therefore, the controller CNTL can receive the read data DT (0a) in synchronization with the first rising edge of the clock CCLK whose output is restarted. That is, the controller CNTL can receive the read data DT at an arbitrary timing not depending on the control timing on the memory MEM side. As a result, the timing design of the controller CNTL can be facilitated.

Also in the controller CNTL, every read data DT is received after the elapse of 5 clocks of the clock CCLK from the supply of the read commands RD. That is, the clocks MCLK, CCLK are stopped and restarted in association with the busy signal BSY and the coincidence signal COIN, so that read latency can be kept constant.

Figure 7:
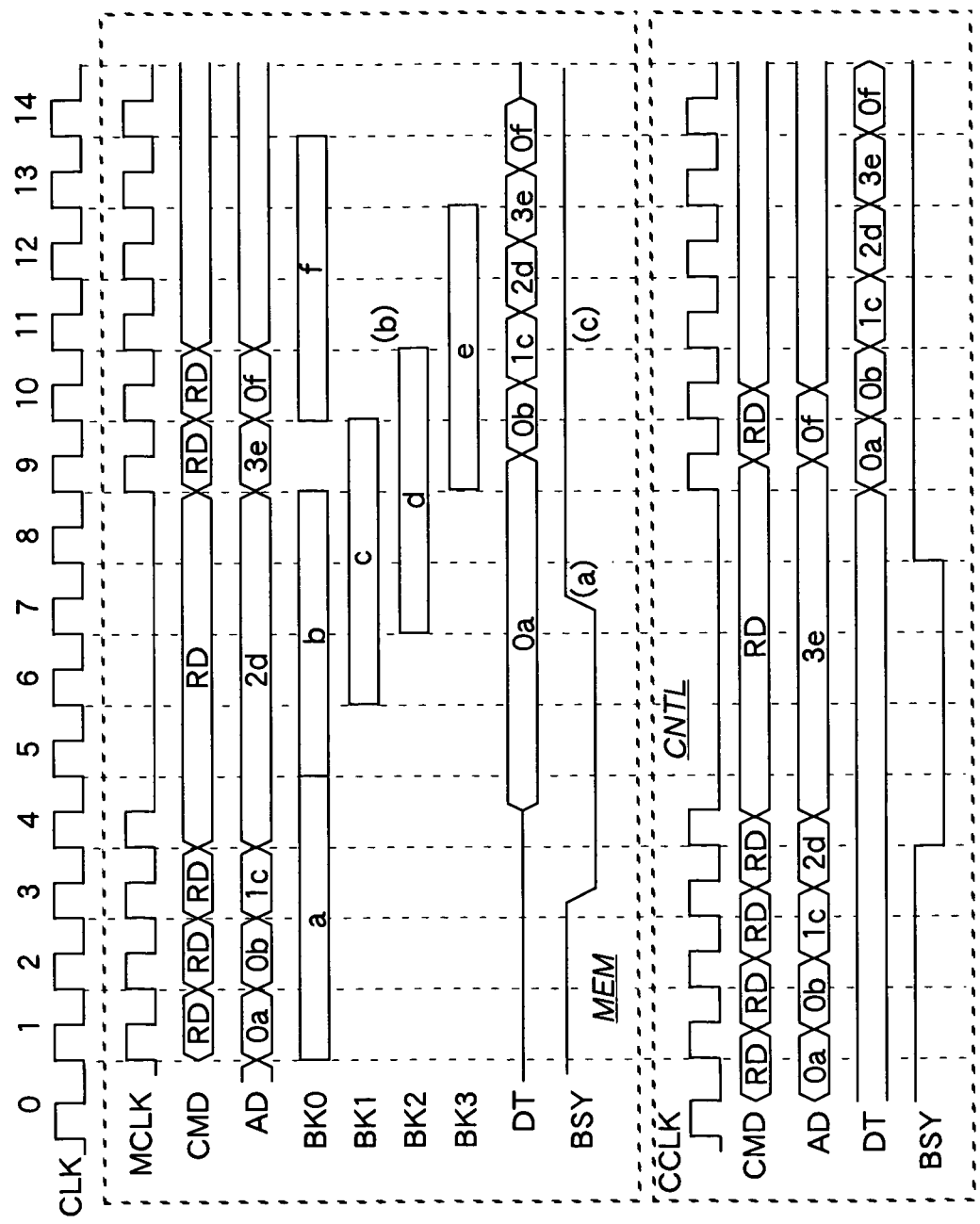
FIG. 7 is a timing diagram of showing another example of an operation of the memory system according to the first embodiment.

FIG. 7 shows another example of the operation of the memory system according to the first embodiment. Also in this example, the controller CNTL supplies a read command RD to the memory MEM six consecutive times. However, the first two read commands RD and the last read command RD are requests for the bank BK0, and the other three read commands RD are requests for the banks BK1-3. The numerals and letters in the waveforms mean the same as those in FIG. 6. The waveforms up to the sixth clock cycle are the same as those in FIG. 6 except for values of addresses AD. Further, the waveforms of and after the 7th clock cycle are the same as the waveforms of and after the 15th clock cycle in FIG. 6 except for the values and the number of the banks BK to operate. Also in this example, the clocks MCLK, CCLK stop while the busy signal BSY is active. Every read data DT is outputted from the memory MEM with read latency="4".

After a read access operation corresponding to the second read command RD (b of BK0) is started, the bank control unit 22 judges that there remains no access operation for the bank BK0 that has not been executed. Based on this judgment, the hold control circuit HCNT shown in FIG. 3 invalidates a bank address BA indicating BK0. Then, as in FIG. 6, the coincidence signals COIN, COIN1 are inactivated and the busy signal BSY is inactivated in synchronization with the 7th clock CLK (FIG. 7(a)).

Bank addresses BA (1, 2, 3, 0) corresponding to the third to sixth read commands RD are all different (FIG. 7(b)). In other words, in operations thereafter, no read access request occurs for a bank BK that in the course of executing a read operation. Therefore, the busy signal BSY is kept inactivated (FIG. 7(c)).

Even though the banks BK1-2 are not executing access operations, the bank control circuit BACNT does not immediately start access operations corresponding to the third and fourth access requests (1c, 2d) held in the hold circuit HREQ, but starts them after an access operation (d) for the bank BK0 is started. In other words, even if the addresses HBA, BA do no coincide with each other, the bank control circuit BACNT holds the access request and the address AD in the hold circuit HREQ when the hold circuit HREQ has already held an access request and an address AD for another bank BK, and executes the access operations in order in which the corresponding held access requests are held. This makes it possible to output read data DT in order in which the corresponding read commands RD are supplied, which can prevent a malfunction of the memory MEM.

Further, the bank control circuit BACNT does not start access operations corresponding to the third and fourth access requests (1c, 2d) simultaneously but sequentially starts them at every clock cycle. This can prevent the timing for starting the activation of a word line WL, the timing for starting precharge of a bit line, and the like from coinciding in the plural banks BK. Owing to the reduced number of circuits whose operations are started simultaneously, peak current at the time of the access operation can be reduced, which can reduce the wiring width of power supply wiring and the like to a minimum. As a result, it is possible to prevent an increase in chip size of the memory MEM.

Figure 8:
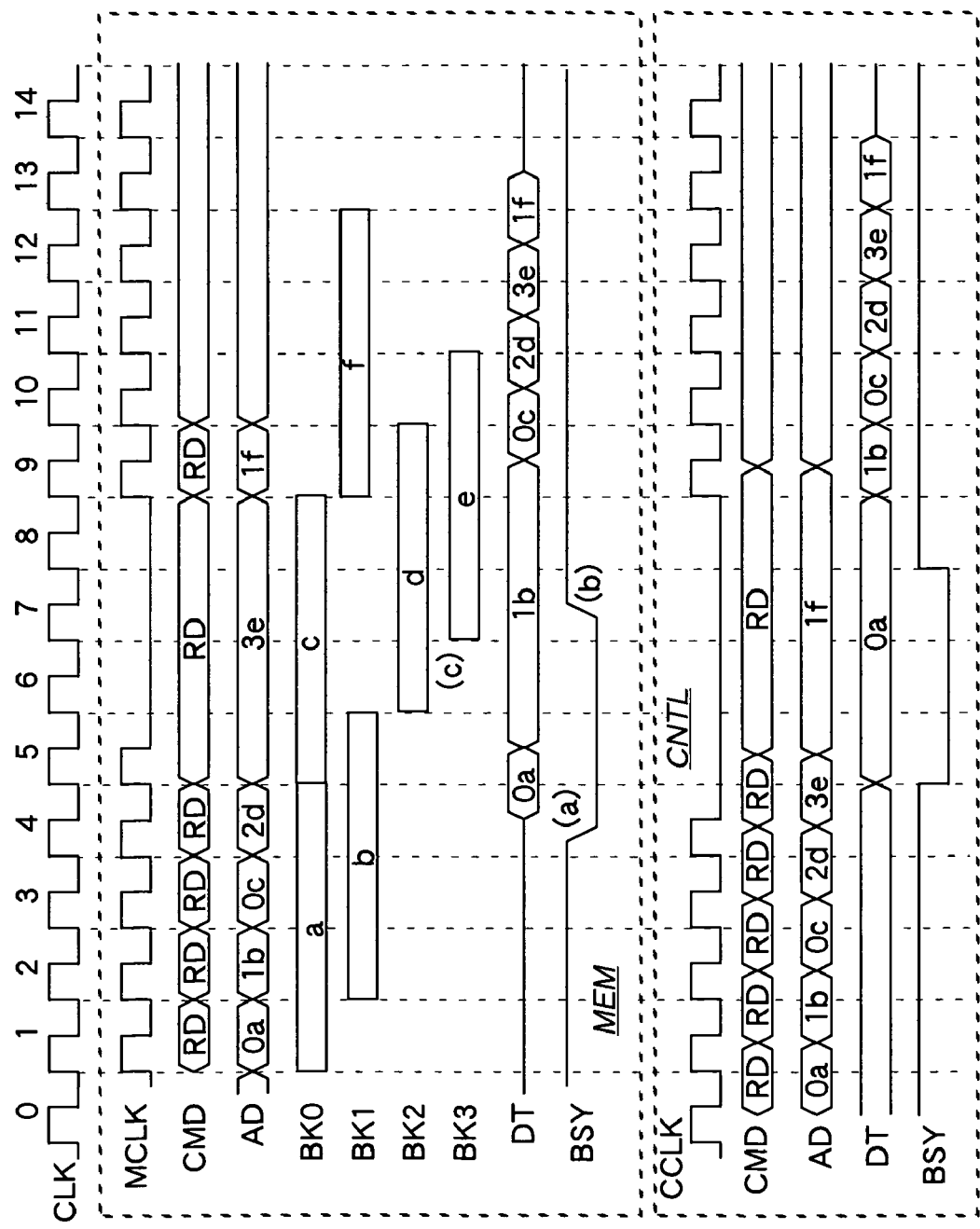
FIG. 8 is a timing diagram of showing another example of an operation of the memory system according to the first embodiment.

FIG. 8 shows another example of the operation of the memory system according to the first embodiment. Also in this example, the controller CNTL supplies a read command RD to the memory MEM six consecutive times. However, in this example, access requests for the banks BK0, BK1, BK0, BK2, BK3, BK1 are sequentially supplied. The numerals and letters in the waveforms mean the same as those in FIG. 6.

In this example, the memory MEM receives a read command RD (0c) for the bank BK0 during the execution of a read access operation (a) of the bank BK0. Concretely, a held bank address HBA1 (BK0) for which the access operation is executed coincides with a newly supplied bank address BA (BK0). Consequently, the busy signal BSY is activated (FIG. 8(*a*)).

When a read access operation corresponding to the third read command RD (c of BK0) is started, there remains no read command RD for the bank BK0 whose corresponding access operation has not been started. Therefore, as in FIG. 6 and FIG. 7, the busy signal BSY is inactivated (FIG. 8(*b*)). Note that access operations of the banks BK 2-3 are sequentially started under the control of the bank control circuit BACNT after the access operation (c) of the bank BK0 is started, as in FIG. 7 (FIG. 8(*c*)). The clocks MCLK, CCLK are stopped while the busy signal BSY is active, but every read data DT is outputted with read latency="4".

FIG. 9 shows another example of the operation of the memory system according to the first embodiment. In this example, the controller CNTL supplies a write command WR to the memory MEM six consecutive times. The first five write commands WR are requests for the bank BK0 and the last one is a request for the bank BK1. The numerals and letters in the waveforms mean the same as those in FIG. 6. Note that a refresh command may be supplied instead of any of the write commands WR. This also applies to FIG. 10-FIG. 12 to be described later. The operation of the memory MEM in this case is the same as the write access operation except that write data DT is not inputted during a refresh operation (access operation) corresponding to the refresh command. As described above, the memory MEM receives the write data (8 bits) supplied from the controller CNTL once to write the received write data DT to the bank BK selected according to an address AD every time it receives the write command WR (access request).

The operation in FIG. 9 is the same as the operation in FIG. 6 except that the write commands WR are supplied instead of the read commands RD in FIG. 6 and the write data DT are supplied to the memory MEM in synchronization with the write commands WR and the write addresses AD. That is, every write access operation is executed in 4 clock cycles (write latency="4"). Therefore, the bank control circuit BACNT and the access control circuit ACS execute the write access operation at the same timing as the timing of the read access operation except for the input/output operations of the data DT. Therefore, the clocks MCLK, CCLK are stopped during the 5th to 16th clock cycles.

The busy signal BSY is activated in synchronization with the third clock CLK and inactivated in synchronization with the 15th clock CLK. Since the clock MCLK is stopped, the data input unit 14 of the memory MEM stops the input operation of new data DT and continues holding the already received write data DT (0*d*) (FIG. 9(*a*)). Stopping the receipt of the new data DT can prevent the supply of unjustified data DT to the memory MEM, which can prevent a malfunction of the memory MEM. The operations of the command input unit 18 and the address input unit 20 are the same as those in FIG. 6. The memory control unit MCNT of the controller CNTL stops the output operations of a new command CMD, a new address AD, and new write data DT. That is, the fourth write command WR, address AD (0*e*), and write data DT (0*d*) are kept outputted (FIG. 9(*b*)).

The command input unit 18, the address input unit 20, and the data input unit 14 of the memory MEM restart the receiving operation of the write command WR, the address AD, and the write data DT when the clock MCLK is restarted (FIG. 9(*c*)). The memory control unit MCNT of the controller CNTL restarts the output operation of the new command CMD, address AD, and write data DT (FIG. 9(*d*)).

Figure 10:
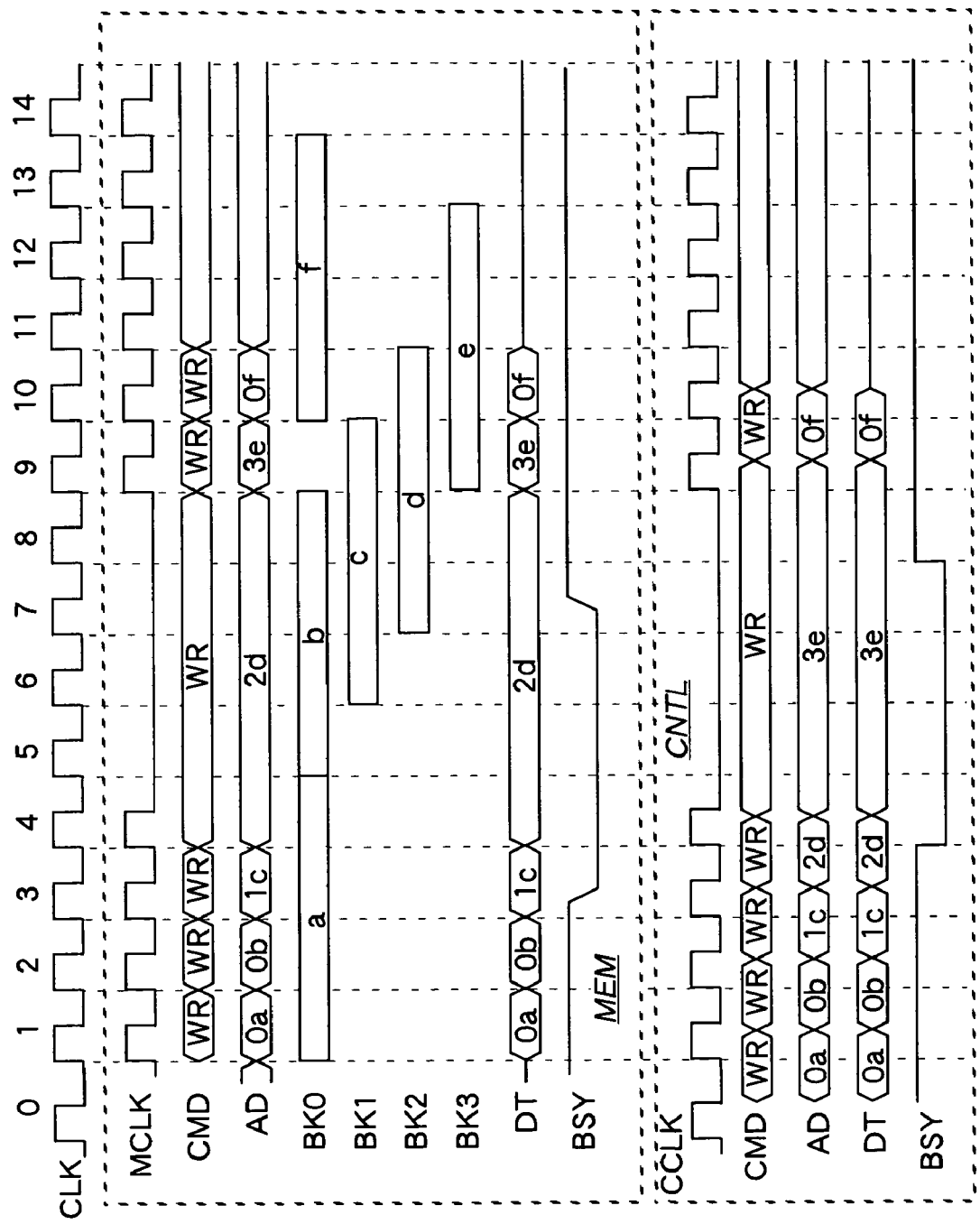
FIG. 10 is a timing diagram of showing another example of an operation of the memory system according to the first embodiment.

FIG. 10 shows another example of the operation of the memory system according to the first embodiment. Also in this example, the controller CNTL supplies a write command WR to the memory MEM six consecutive times. However, the first two write commands WR and the last one are requests for the bank BK0 and the other three write commands WR are requests for the banks BK1-3. The numerals and letters in the waveforms mean the same as those in FIG. 6.

The operation in FIG. 10 is the same as the operation in FIG. 7 except that the write commands WR are supplied instead of the read commands RD in FIG. 7 and write data DT are supplied to the memory MEM in synchronization with the write commands WR and write addresses AD. That is, every write access operation is executed in 4 clock cycles (write latency="4"). The clocks MCLK, CCLK are stopped during the 5th to 8th clock cycles. The operations of the memory MEM and the controller CNTL at the time of write access operations are the same as those in FIG. 9.

Figure 11:
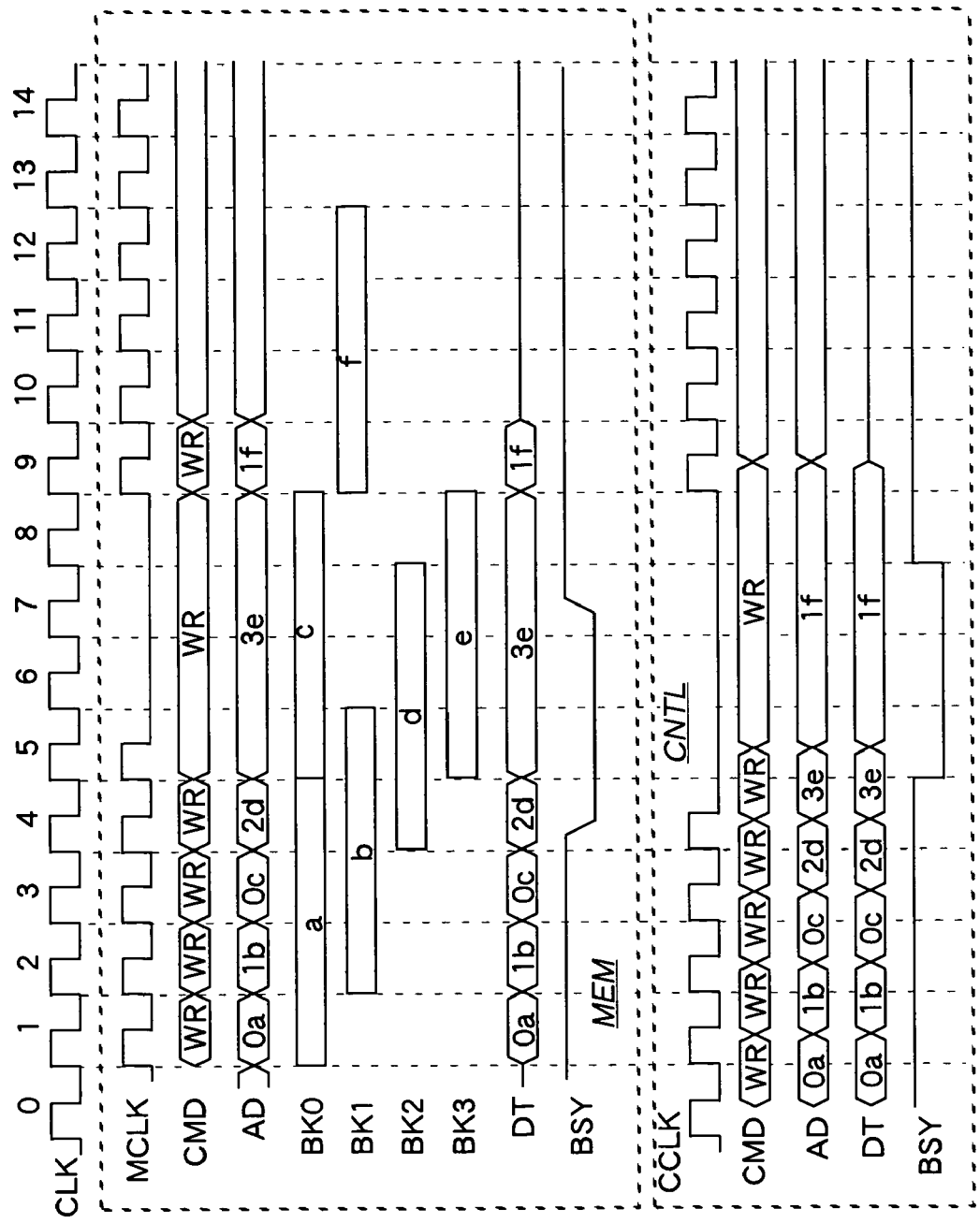
FIG. 11 is a timing diagram of showing another example of an operation of the memory system according to the first embodiment.

FIG. 11 shows another example of the operation of the memory system according to the first embodiment. Also in this example, the controller CNTL supplies a write command WR to the memory MEM six consecutive times. However, in this example, access requests for the banks BK0, BK1, BK0, BK2, BK3, BK1 are sequentially supplied. The numerals and letters in the waveforms mean the same as those in FIG. 6.

The operation in FIG. 11 is the same as the operation in FIG. 8 except that the write commands WR are supplied instead of the read commands RD in FIG. 8 and write data DT are supplied to the memory MEM in synchronization with the write commands WR and write addresses AD. That is, every write access operation is executed in 4 clock cycles (write latency="4"). The clocks MCLK, CCLK are stopped during the 5th to 8th clock cycles. The operations of the memory MEM and the controller CNTL at write access operations are the same as those in FIG. 9.

Figure 12:
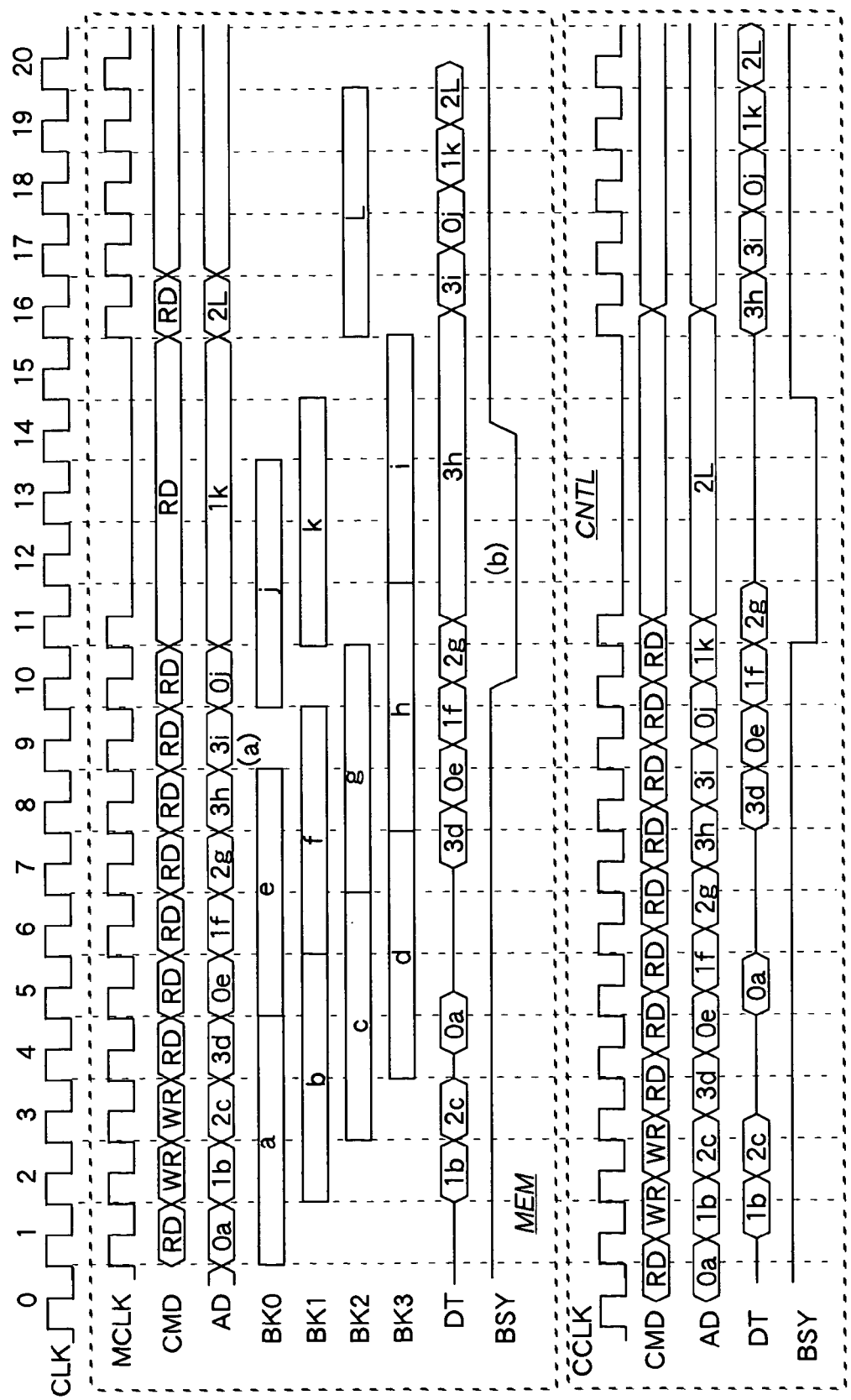
FIG. 12 is a timing diagram of showing another example of an operation of the memory system according to the first embodiment.

FIG. 12 shows another example of the operation of the memory system according to the first embodiment. In this example, read access requests RD and write access requests WR are supplied to the memory MEM. Since the data terminal DT is commonly used for input and output, it is necessary for the controller CNTL to output write data DT at the timing not coinciding with the receiving timing of the read data DT. Therefore, the timing specification of signals for operating the memory MEM are set so that the timing of the write data DT and the timing of the read data DT do not coincide with each other. The numerals and letters in the waveforms mean the same as those in FIG. 6.

In this example, the memory MEM receives a read command RD for the bank BK3 in synchronization with the 9th clock MCLK during a read access operation of the bank BK3 (FIG. 12(*a*)). Consequently, the busy signal BSY is activated in synchronization with the 10th clock MCLK and inactivated in synchronization with the 14th clock MCLK (FIG. 12(*b*)). The clocks MCLK, CCLK are stopped while the busy signal BSY is active. Every read access cycle is finished in 4 clock cycles (read latency="4"). Every write access cycle is finished in 4 clock cycles (write latency="4").

In the above-described first embodiment, the memory MEM has a function of simultaneously accessing 4 banks BK out of the 128 banks BK, and outputs the busy signal BSY when receiving the access request for the bank BK executing the access operation. Relatively increasing the number of banks BK in non-operation can decrease the probability that the busy signal BSY is activated at the time of the random access. As a result, the data transfer rate at the time of the random access can be improved. Further, being notified of the state of the memory MEM by the busy signal BSY, the controller CNTL accessing the memory MEM can access the memory MEM without judging whether the access operations are continuously executable or not. This eliminates a need for an advance work in which data to be stored in the memory MEM are allocated to the plural banks. As a result, it is possible to easily execute the random access without giving any load to the system side.

The access control circuits ACS1-4, the control signal buses CNTB1-4, the hold circuits HOL1-4, and the comparators CMP1-4 are equal in number to the access cycle number (=4), which can reduce the scale and layout area of circuits formed in the memory MEM to a minimum, resulting in a reduced chip size of the memory MEM.

Figure 13:
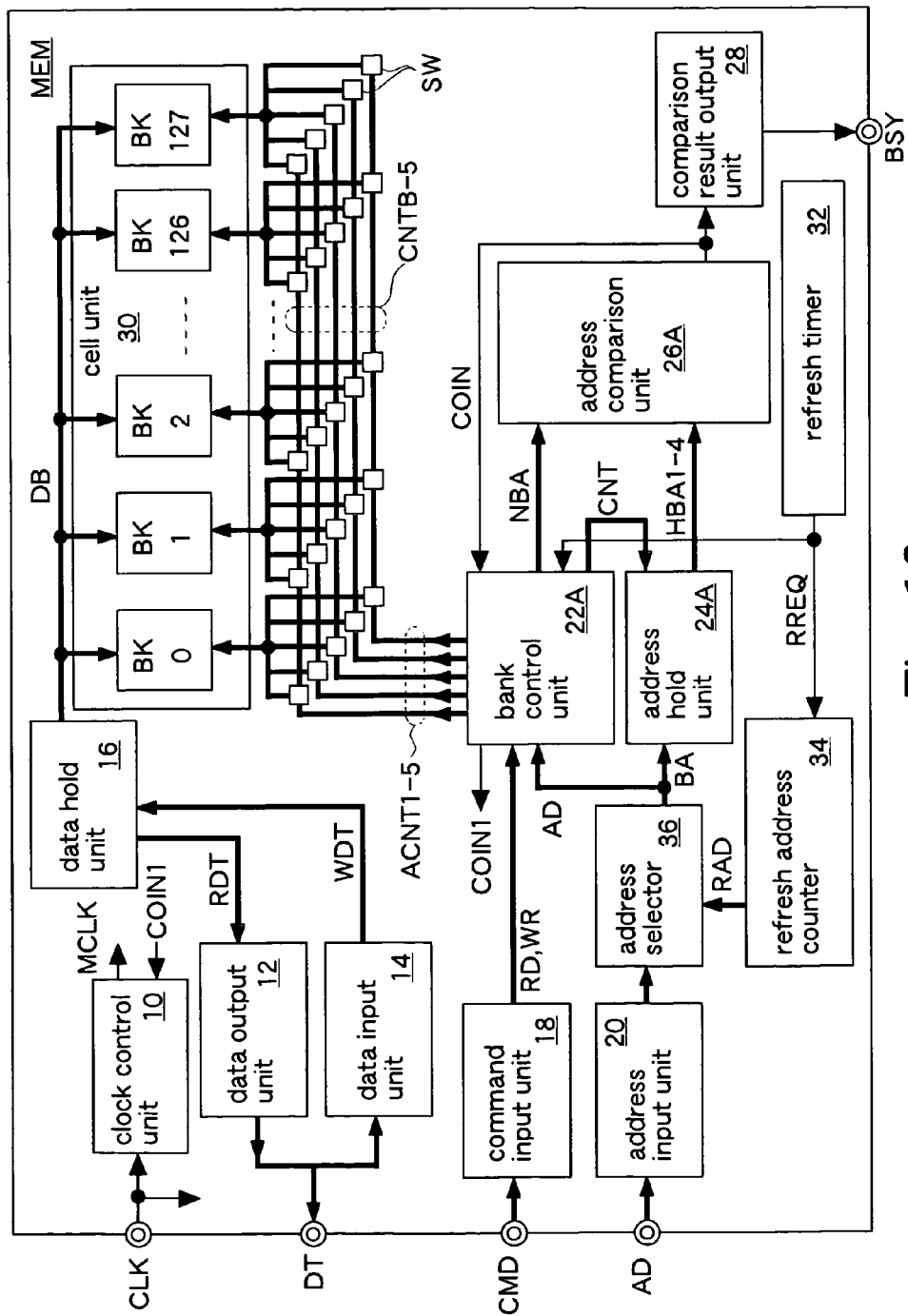
FIG. 13 is a block diagram showing a semiconductor memory of a second embodiment in the present invention.

FIG. 13 shows a second embodiment of the present invention. The same reference symbols are used to designate the same elements as the elements described in the first embodiment, and detailed description thereof will be omitted. A semiconductor memory MEM of this embodiment is, for example, a clock synchronous type pseudo SRAM. The pseudo SRAM has memory cells of a DRAM and an input/output interface that is the same as that of a SRAM. The pseudo SRAM internally and automatically executes a refresh operation for the memory cells. A controller accessing the pseudo SRAM is capable of accessing the pseudo SRAM without being aware of the refresh operation. Access commands supplied to a command terminal CMD are a read command and a write command, and no refresh command exists.

The memory MEM has a bank control unit 22A, an address hold unit 24A, and an address comparison unit 26A in place of the bank control unit 22, the address hold unit 24, and the address comparison unit 26 of the memory MEM of the first embodiment. The semiconductor memory MEM newly has a refresh timer 32 (internal access request generation unit), a refresh address counter 34, an address selector 36, a control signal bus CNTB5, and a switch part SW connected to the control signal bus CNTB5. The other configuration is the same as that of the first embodiment.

The refresh timer 32 generates a refresh request RREQ (internal access request) at a predetermined cycle. The refresh address counter 34 is a counter updating a refresh address RAD in synchronization with the refresh request RREQ. The refresh address RAD is an address indicating a word line WL to be connected to a memory cell MC for which the refresh operation is to be executed. Under the control by the bank control unit 22A, the address selector 36 outputs one of an address AD and a refresh address RAD, which are supplied via an address terminal AD, to the bank control unit 22A and the address hold unit 24A.

Figure 14:
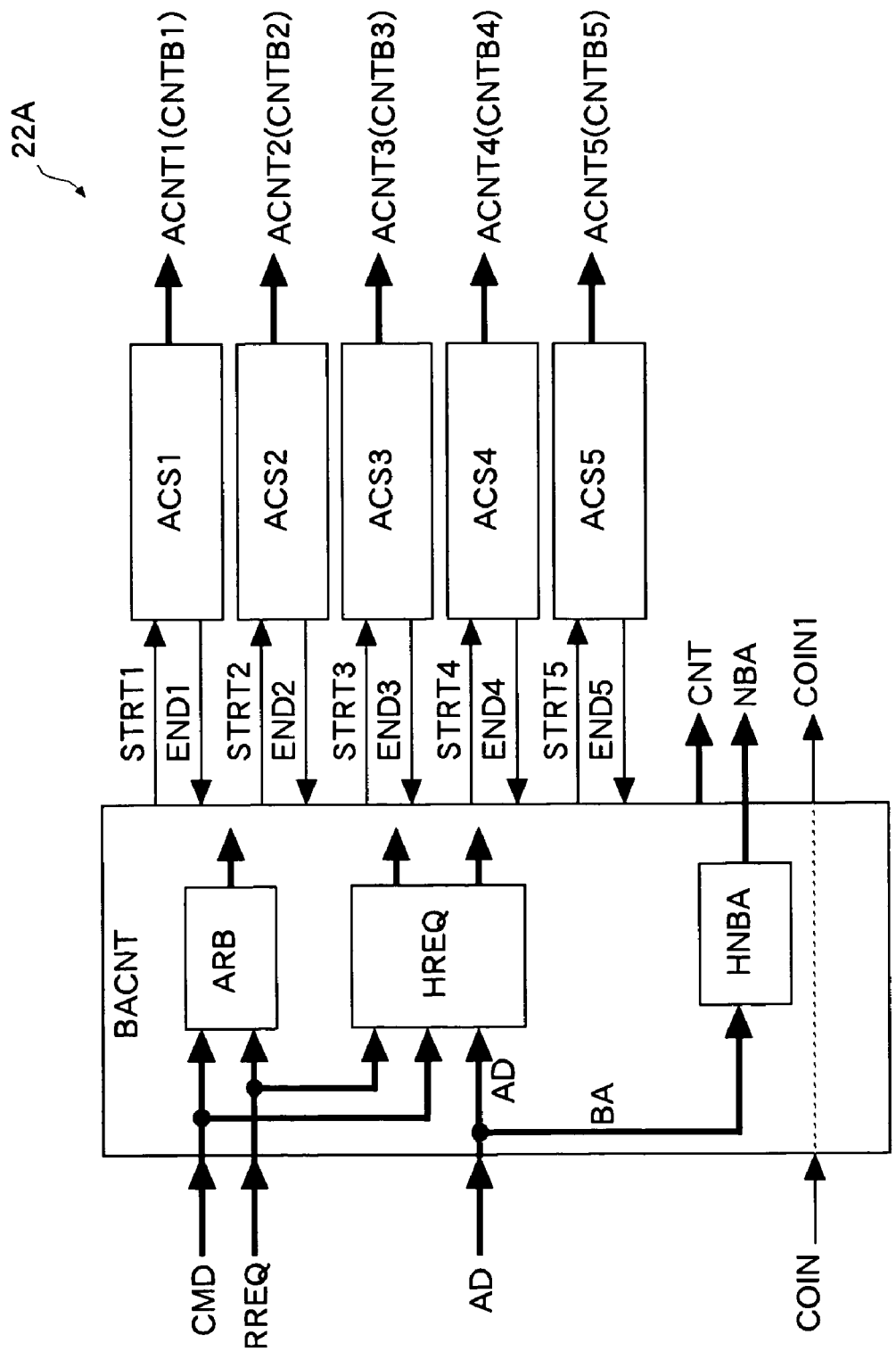
FIG. 14 is a block diagram showing the details of the bank control unit shown in FIG. 13.

FIG. 14 shows the details of the bank control unit 22A shown in FIG. 13. The bank control unit 22A has, in addition to the structure shown in FIG. 2, an access control circuit ACS5 for generating an access control signal ACNT5 which is to be outputted to the control signal bus CNTB5. The bank control circuit BACNT of the bank control unit 22A has an arbiter ARB for deciding the priority sequence when the access commands RD, WR and the refresh request RREQ (refresh command) contend with one another. A hold unit HREQ has a function of temporarily holding the refresh request RREQ in addition to the function of the first embodiment.

The bank control circuit BACNT outputs an access start signal STRT5 for operating the access control circuit ACS5 to the access control circuit ACS5 and receives an access end signal ENDS from the access control circuit ACS5. Further, the bank control circuit BACNT receives the access commands CMD (RD, WR) and the refresh command RREQ as an access command to execute a read access operation, a write access operation, and a refresh operation for banks BK0-127 via the access control circuits ACS1-S. The other configuration in the bank control unit 22A is the same as that in the bank control unit 22 of the first embodiment.

Figure 15:
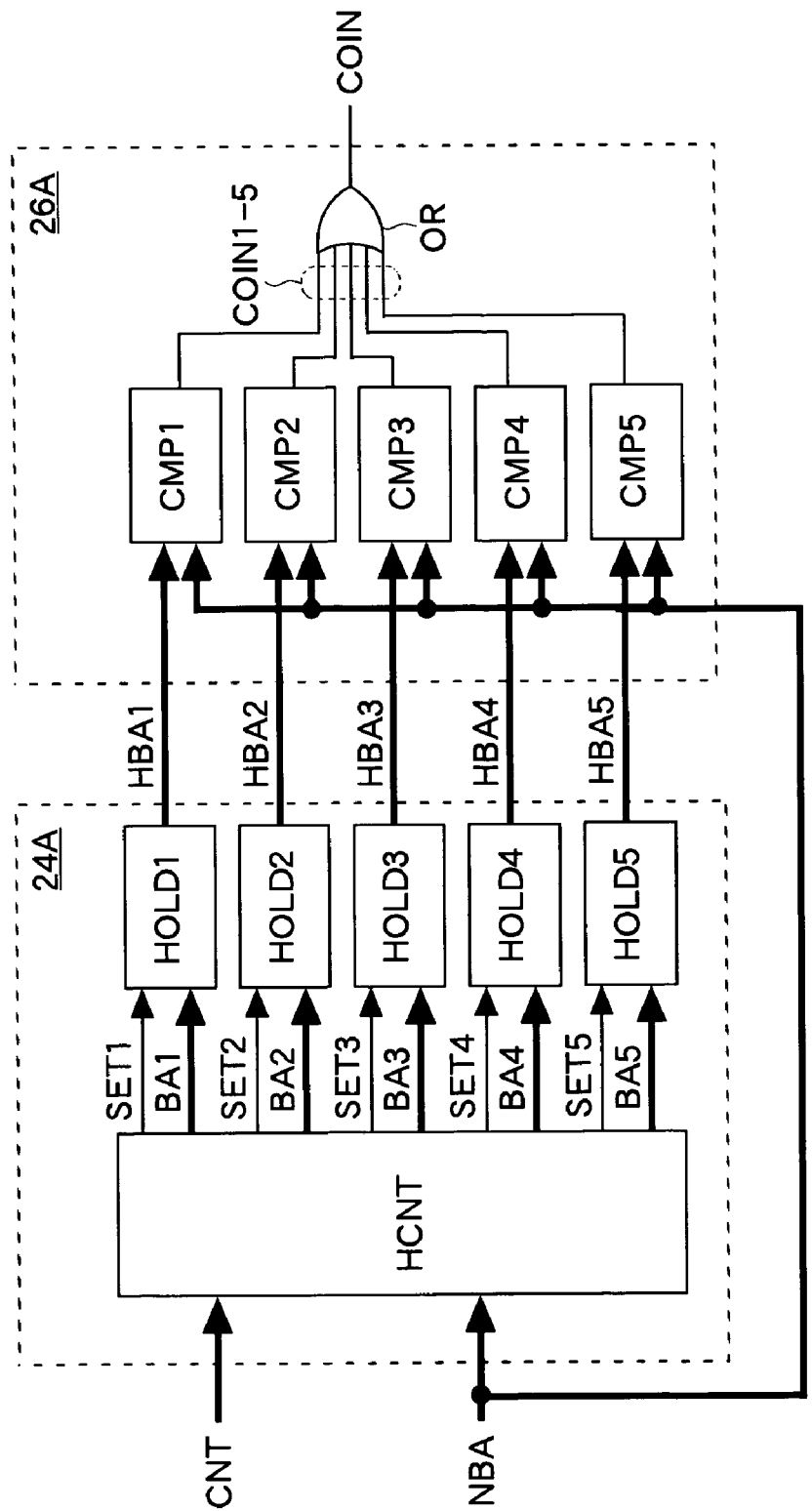
FIG. 15 is a block diagram showing the details of the address hold unit and the address comparison unit shown in FIG. 13.

FIG. 15 shows the details of the address hold unit 24A and the address comparison unit 26A shown in FIG. 13. The address hold unit 24A has, in addition to the structure shown in FIG. 3, a hold circuit HOLDS outputting a held bank address HBA5. A hold control circuit HCNT of the address hold unit 24A outputs a set signal SETS and a bank address BA5 to the hold circuit HOLDS. The other configuration in the address hold unit 24A is the same as that in the address hold unit 24 of the first embodiment.

The address comparison unit 26A has, in addition to the structure shown in FIG. 3, a comparator CMPS comparing a bank address NBA with the held bank address HBA5. Outputs of the comparators CMP1-5 are OR-operated and the result is outputted as a coincidence signal COIN. The other configuration in the address comparison unit 26A is the same as that of the address comparison unit 26 of the first embodiment.

In this embodiment, as in the first embodiment, a cell unit 30 has the 128 banks BK0-127. An access cycle of the banks BK is 4 clock cycles. Here, the access cycle is the clock cycle number necessary for executing the read access operation once, the write access operation once, or the refresh operation once. The refresh operation is executed in one of the banks BK in response to the one refresh request RREQ.

In this embodiment, the number of the control signal buses CNTB, the number of the access control circuits ACS of the bank control unit 22A, the number of the hold circuits HOLD of the address hold unit 24A, and the number of the comparators CMP of the address comparison unit 26A are equal to the sum (=5) of the access cycle number and "1". That is, the number of banks BK simultaneously operable is "5". Therefore, even while the refresh operation is being executed in one of the banks BK, the read command RD and the write command WR can be continuously received in synchronization with a clock CLK, and each of the access operations corresponding to the commands RD, WR can be executed in 4 clock cycles (access cycle number=4). This can reduce the circuit scale of the memory MEM to a minimum, resulting in a reduced chip size of the memory MEM.

In the present invention, the number of the access control signals ACNT may be any number equal to or larger than the access cycle number+1 and smaller than the number of the banks BK. Further, in a case where the refresh operations are started in "n" banks BK in response to one refresh request RREQ, such design is required that the number of the banks BK simultaneously operable is "4+n". In this case, the number of the control signal buses CNTB, the number of the access control circuits ACS, the number of the hold circuits HOLD, and the number of the comparators CMP need to be "4+n".

Figure 16:
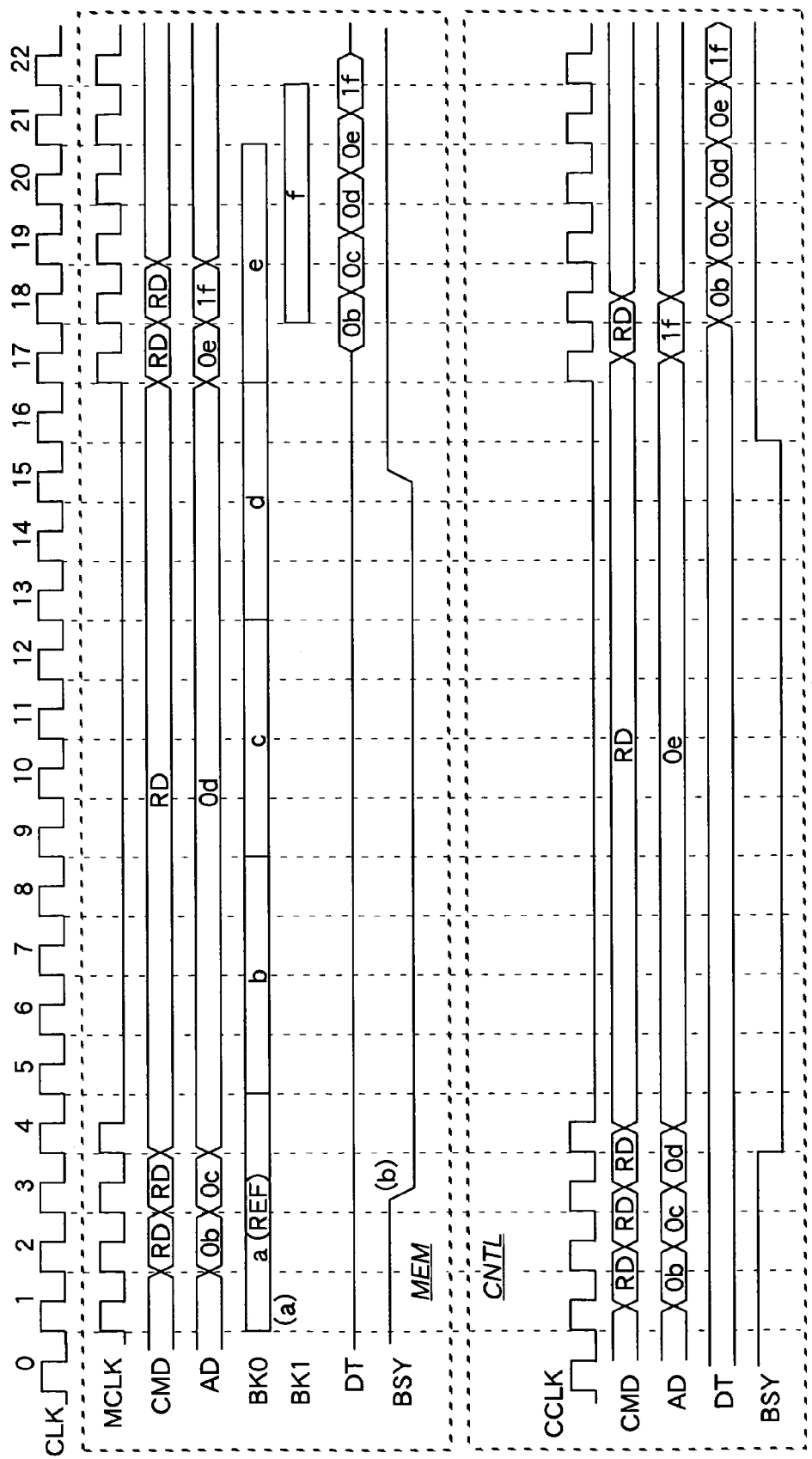
FIG. 16 is a timing diagram of showing an example of an operation of the memory system according to the second embodiment.

FIG. 16 shows an example of the operation of a memory system according to the second embodiment. In this example, a controller CNTL supplies a read command RD to the memory MEM five consecutive times. The first four read commands RD are requests for the bank BK0 and the last one is a request for the bank BK1. Further, a refresh request RREQ for the bank BK0 is generated before the first read command RD is supplied, and the bank BK0 executes a refresh operation REF prior to the first read access operation (FIG. 16(*a*)). The numerals and letters in the waveforms mean the same as those in FIG. 6.

A bank address BA of the bank BK0 in which the refresh operation REF is being executed is held in the address hold unit 24A. Therefore, a busy signal BSY is outputted in response to the supply of the first read command RD (FIG. 16(*b*)). The operation of the memory MEM thereafter is the same as that in FIG. 6 except that the first read data DT (0*b*) is outputted in synchronization with the 17th clock MCLK. The operation of the controller CNTL is the same as that in FIG. 6 except that the first read command RD (0*b*) is outputted in synchronization with the 1 st clock CCLK and the first read data DT (0*b*) is received in synchronization with the 18th clock CCLK. Therefore, in this embodiment, even though the refresh operation REF is internally and automatically executed, every read data DT can be outputted with read latency="4". In other words, the controller CNTL can access the memory MEM without being aware of the refresh operation.

Figure 17:
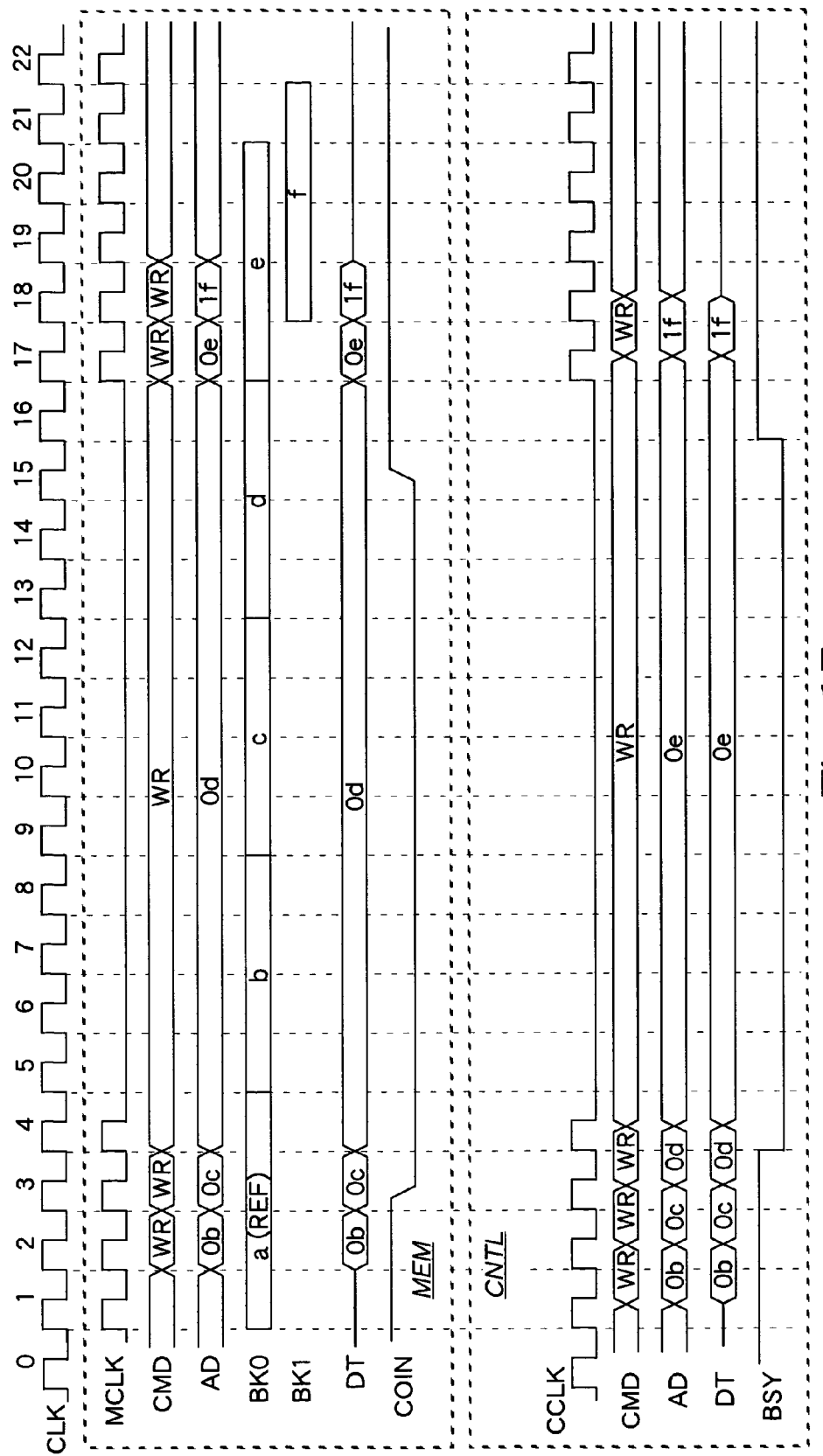
FIG. 17 is a timing diagram of showing another example of an operation of the memory system according to the second embodiment.

FIG. 17 shows another example of the operation of the memory system according to the second embodiment. In this example, the controller CNTL supplies a write command WR to the memory MEM five consecutive times. The first four write commands WR are requests for the bank BK0 and the last one is a request for the bank BK1. Further, a refresh request RREQ for the bank BK0 is generated before the first write command WR is supplied, and the bank BK0 executes a refresh operation REF prior to the first write access operation (FIG. 17(*a*)). The numerals and letters in the waveforms mean the same as those in FIG. 6.

The operation of the memory MEM after the refresh operation is the same as that in FIG. 9 except that the first write data DT (0*a*) is not supplied. Therefore, in this embodiment, as in FIG. 16, even though the refresh operation REF is internally and automatically executed, every write access operation can be executed with write latency="4". In other words, the controller CNTL can access the memory MEM without being aware of the refresh operation.

The second embodiment described above can also provide the same effects as those of the above-described first embodiment. In addition, in this embodiment, when the memory MEM has a function of automatically, internally executing the refresh operation, the controller CNTL can also access the memory MEM based on the busy signal BSY without judging whether or not the access operation is continuously executable. Therefore, it is possible to easily execute the random access without giving any load to the system side.

Figure 18:
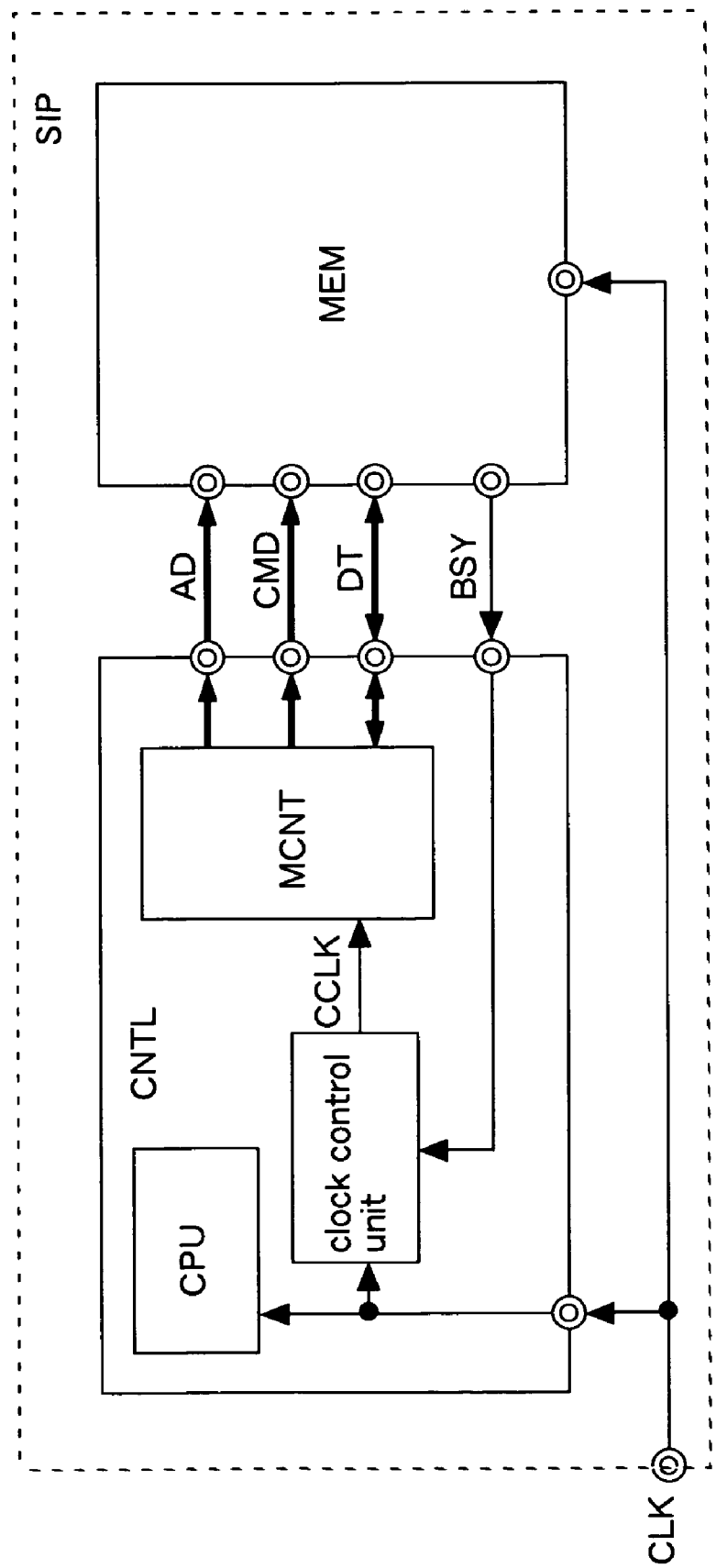
FIG. 18 is a block diagram showing a memory system of a third embodiment in the present invention.

FIG. 18 shows a third embodiment of the present invention. The same reference symbols are used to designate the same elements as the elements described in the first and second embodiments, and detailed description thereof will be omitted. In this embodiment, a memory system is formed as a system-in-package SIP. The SIP has the semiconductor memory of the first embodiment and a controller CNTL accessing the semiconductor memory MEM. The controller CNTL is the same as that in FIG. 4. Note that the memory MEM of the second embodiment may be used to constitute the SIP. The operation of the SIP is the same as those in FIG. 6-FIG. 12 or in FIG. 16-FIG. 17 described above. The above-described third embodiment can also provide the same effects as those of the first and second embodiments described above.

Figure 19:
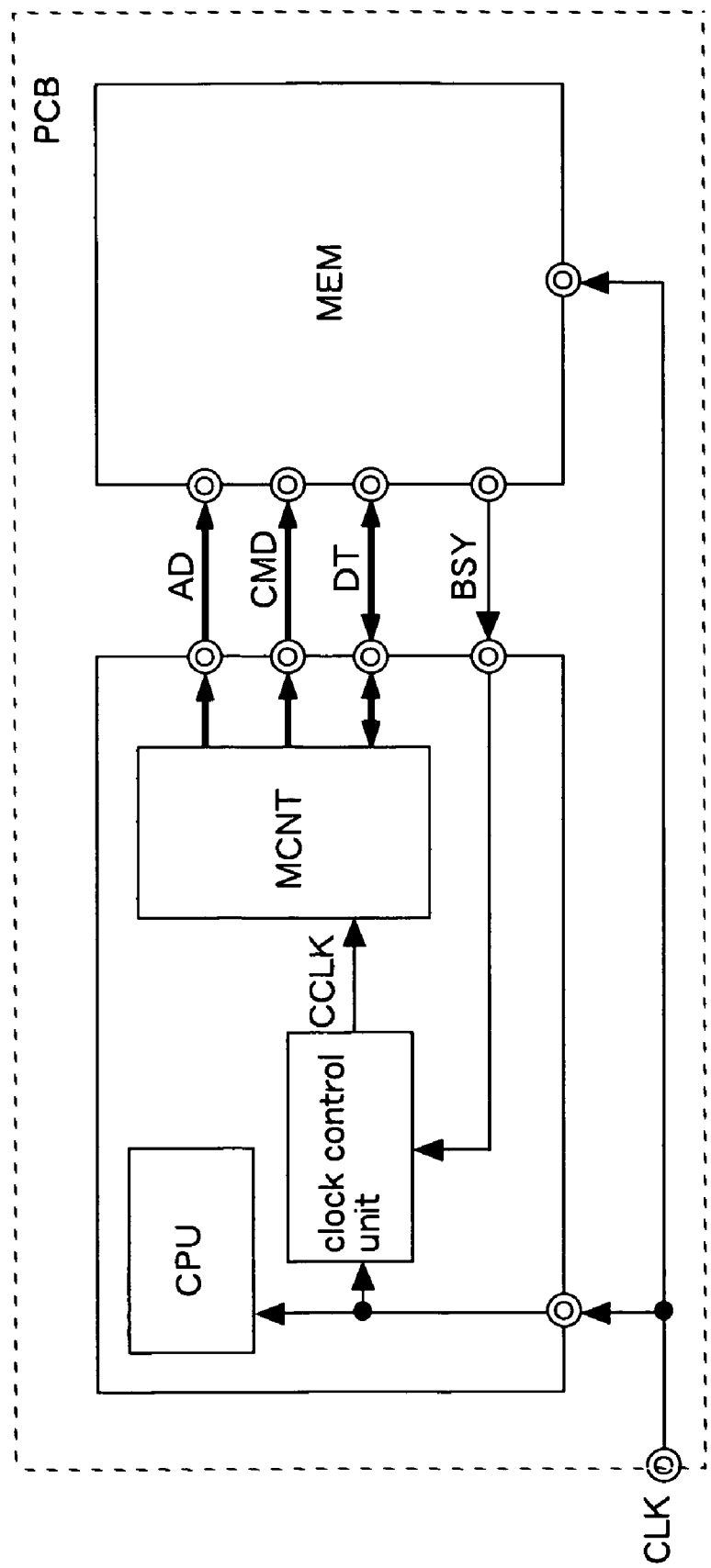
FIG. 19 is a block diagram showing a memory system of a fourth embodiment in the present invention.

FIG. 19 shows a fourth embodiment of the present invention. The same reference symbols are used to designate the same elements as the elements described in the first and second embodiments, and detailed description thereof will be omitted. In this embodiment, a semiconductor memory MEM and a controller CNTL are mounted on a printed-wiring board PCB to constitute a memory system. The semiconductor memory MEM and the controller CNTL are the same as those of the first embodiment (FIG. 4). Note that the memory MEM of the second embodiment may be used to constitute the PCB. The operation of the PCB is the same as those in FIG. 6-FIG. 12 or in FIG. 16-FIG. 17 described above. The above-described fourth embodiment can also provide the same effects as those of the first and second embodiments described above.

Figure 20:
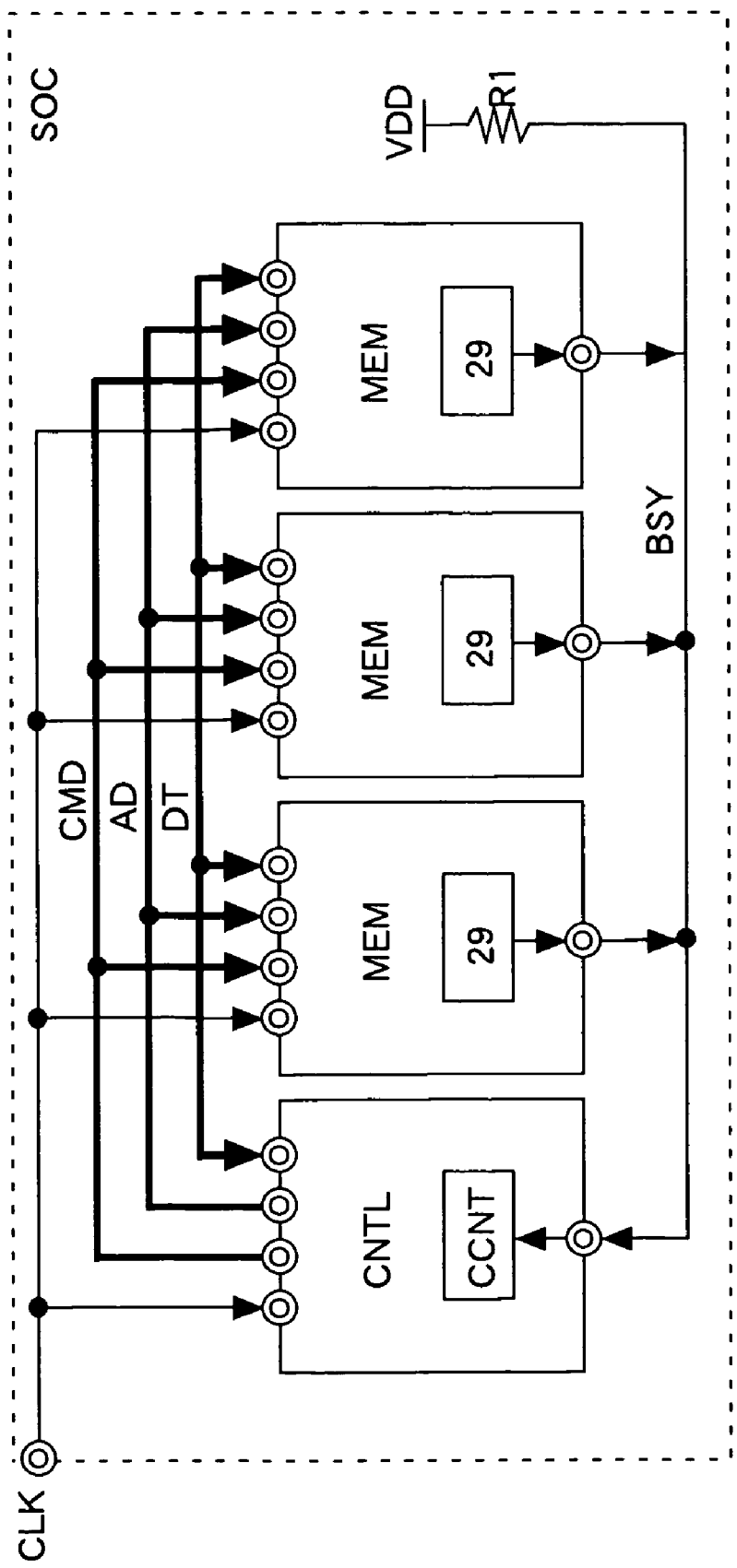
FIG. 20 is a block diagram showing a memory system of a fifth embodiment in the present invention.

FIG. 20 shows a fifth embodiment of the present invention. The same reference symbols are used to designate the same elements as the elements described in the first and second embodiments, and detailed description thereof will be omitted. In this embodiment, a memory system is formed as a system LSI (SOC) integrated on a silicon substrate. The SOC has three semiconductor memories MEM and a controller CNTL accessing the semiconductor memories MEM.

The memories MEM are allocated to different address spaces and are connected to a command line CMD, an address line AD, and a data line DT which are common thereto. The controller CNTL outputs a command CMD, an address AD, and write data DT and receives read data DT. The command CMD includes a chip select signal for activating the memories MEM. The controller CNTL accesses one of the memories MEM by using the chip select signal.

As each of the memories MEM, the memory MEM of the first or second embodiment is used. However, the comparison result output unit 29 sets a busy signal BSY to low-logic level (first logic level) when activating the busy signal BSY, and when inactivating the busy signal BSY, it sets the busy signal BSY not to high-logic level but to a high impedance state (open state). Therefore, the comparison result output unit 29 has a tri-state output buffer (not shown) whose output is connected to a busy terminal BSY.

The busy signals BSY outputted from the memories MEM respectively are outputted to a common busy signal line BSY. The common busy signal line BSY is connected to a power supply line VDD via a resistor R1. That is, the common busy signal line BSY is pulled up. Consequently, while the busy signal BSY is inactive, the common busy signal line BSY is set to high-logic level (second logic level). The resistor R1 and the power supply line VDD function as a level fixed part.

When the common busy signal line BSY has low-logic level, the clock control unit CCNT of the controller CNTL recognizes that the busy signal BSY is active, to stop generating the clock CCLK. When the common busy signal line BSY has high-logic level, the clock control unit CCNT recognizes that the busy signal BSY is inactive, to restart the generation of the clock CCLK. In this manner, in this embodiment, the controller CNTL can recognize, from the single common busy signal line BSY, the busy signals BSY outputted from the memories respectively.

The fifth embodiment described above can also provide the same effects as those of the first and second embodiments described above. In addition, since the memory system includes the plural memories MEM, it is possible to decrease the probability that the busy signals BSY are activated when the controller CNTL random-accesses the memories MEM. As a result, the data transfer rate at the time of the random access can be improved.

The foregoing embodiments have described the examples where the present invention is applied to the SDRAM and the clock synchronous type pseudo SRAM. The present invention is not limited to such embodiments. For example, the present invention may be applied to a clock synchronous type SRAM or a NOR type flash memory.

The above second embodiment has described the example where the refresh request RREQ is generated as the internal access request at a predetermined cycle. The present invention is not limited to such an embodiment. For example, in a case where the memory MEM has a relief circuit automatically relieving a faulty memory cell MC while the power is on, a relief operation cycle may be generated as the internal access request at a predetermined cycle. The relief circuit has: a circuit periodically selecting a word line WL in sequence and generating an error correction code (ECC) for relieving the faulty memory cell MC; and a memory cell MC holding the error correction code.

The foregoing embodiments have described the examples where the address comparison units 26, 26a compare all the bits (7 bits) of the bank address BA. The present invention is not limited to such embodiments. For example, the address comparison units 26, 26a may compare part of the bits (for example, low-order 6 bits) of the bank address BA. In this case, the busy signal BSY is kept active also while an adjacent bank BK is executing an access operation. At this time, the probability of the random access of the memory MEM is 90.1%. This probability is equal to the probability in a case where 64 banks BK are provided. However, if, even with this probability, the specification of the data transfer rate of the memory system can be satisfied, the circuit scale of the address hold units 24, 22A, the address comparison units 26, 26A, and the bank control units 22, 22A can be reduced and the number of signal lines provided in these circuits can be reduced. As a result, the memory MEM can be downsized, which can curtail cost of the memory system.

The above fifth embodiment has described the example where the memory system is formed as the SOC. The present invention is not limited to such an embodiment. For example, the memory system may be formed as the SIP shown in the third embodiment or as the PCB shown in the fourth embodiment.

The above first embodiment has described the example where the output of the access address AD from the controller CNTL, the receipt of the access address AD by the memory MEM, the comparison operation of the addresses HBA, BA, the output of the comparison result, and the receipt of the comparison result by the controller CNTL are sequentially executed in synchronization with the clock CLK. The present invention is not limited to such an embodiment. For example, these operations may be executed in sequence at an interval of a predetermined delay time. Especially when the present invention is applied to a clock asynchronous type semiconductor memory, the aforesaid operations are desirably controlled with the delay time.

The invention is not limited to the above embodiments and various modifications may be made without departing from the spirit and scope of the invention. Any improvement may be made in part or all of the components.

What is claimed is:

1. A semiconductor memory comprising:
a plurality of banks having memory cells each and operable independently from each other;
a bank control unit controlling access operations to said banks;
an address hold unit holding a bank address indicating a bank currently in the access operation;
an address comparison unit comparing the bank address held by said address hold unit with a bank address included in an external address which is supplied together with an access request from an exterior; and
a comparison result output unit keeping activating a busy signal while a result of the comparison by said address comparison unit indicates coincidence; and
a data input unit receiving data to be written to said banks, wherein
a number of said banks is larger than a number of banks simultaneously accessible by said bank control unit, and
the data input unit stops receiving new data while the comparison result of said address comparison unit indicates the coincidence.

2. The semiconductor memory according to claim 1, wherein
upon every access request, said bank control unit accesses one of said banks in order to output data to an exterior of the semiconductor memory once or in order to receive data from the exterior of the semiconductor memory once.

3. The semiconductor memory according to claim 1, wherein:
said address hold unit holds the bank address included in said external address while the bank corresponding to said external address is in the access operation; and
said bank control unit temporarily holds said access request and said external address when the comparison result indicates the coincidence, while starting the access operation to the bank corresponding to said external address when the comparison result indicates non-coincidence.

4. The semiconductor memory according to claim 3, wherein,
in a case where said bank control unit temporarily holds said access request and said external address, said bank control unit temporarily holds a new access request and a new external address even when the comparison result indicates the non-coincidence, and executes access operations in order in which it has held the access requests.

5. The semiconductor memory according to claim 1, wherein:
the semiconductor memory operates in synchronization with a clock;
the access operation is executed once in a period corresponding to an access cycle number which is a predetermined clock cycle number; and
a number of the bank addresses held by said address hold unit is equal to or larger than said access cycle number and smaller than the number of said banks.

6. The semiconductor memory according to claim 1, wherein:
said address hold unit holds at least part of said bank address; and
said address comparison unit compares the at least part of said bank address with at least part of the bank address included in said external address.

7. The semiconductor memory according to claim 1, wherein:
the semiconductor memory operates in synchronization with a clock;
the access operation is executed once in a period corresponding to an access cycle number which is a predetermined clock cycle number;
said bank control unit includes a plurality of bank access circuits each accessing one of said banks independently; and
a number of said bank access circuits is equal to or larger than said access cycle number and smaller than the number of said banks.

8. The semiconductor memory according to claim 1, further comprising an internal access request generation unit generating an internal access request for accessing said banks, wherein:
the semiconductor memory operates in synchronization with a clock
the access operation is executed once in a period corresponding to an access cycle number which is a predetermined clock cycle number;
said bank control unit includes a plurality of bank access circuits each accessing one of said banks independently; and
a number of said bank access circuits is equal to or larger than a sum of said access cycle number and 1, and smaller than the number of said banks.

9. The semiconductor memory according to claim 8, further comprising
a plurality of control signal buses which are provided in correspondence with said bank access circuits respectively and through which access control signals outputted from the respective bank access circuits are supplied to said banks.

10. The semiconductor memory according to claim 1, wherein:
said address comparison unit executes a comparison operation in synchronization with a first timing that is a point of time when a first time has passed from the supply of said external address; and
said comparison result output unit outputs said busy signal in synchronization with a second timing that comes later than said first timing.

11. The semiconductor memory according to claim 1, further comprising a data output unit outputting data read from said banks to the exterior, wherein,
when the comparison result of said address comparison unit indicates the coincidence while one of said banks is in a read operation as the access operation, said data output unit outputs data read from the bank that is currently in the read operation, and continues to output the read data while the comparison result indicates the coincidence.

12. The semiconductor memory according to claim 1, further comprising:
a clock control unit generating an internal clock based on an external clock and stopping the internal clock upon the coincidence, wherein
the data input unit operates in synchronization with the internal clock.

13. The semiconductor memory according to claim 1, further comprising an address input unit receiving said external address, wherein
said address input unit stops receiving a new external address while the comparison result of said address comparison unit indicates the coincidence.

14. A memory system comprising at least one semiconductor memory and a controller having an access control unit controlling access to the semiconductor memory, wherein:
the at least one semiconductor memory comprises:
a plurality of banks having memory cells each and operable independently from each other;
a bank control unit controlling access operations to said banks;
an address hold unit holding a bank address indicating a bank currently in the access operation;
an address comparison unit comparing the bank address held by said address hold unit with a bank address included in an external address which is supplied together with an access request from an exterior; and
a comparison result output unit keeping activating a busy signal while a result of the comparison by said address comparison unit indicates coincidence,
said controller comprises:
the access control unit outputting an access command, said external address, and write data for accessing said semiconductor memory and receives read data from said semiconductor memory; and
a comparison result receiving unit receiving said busy signal, and
said access control unit stopping output of a next access command, a next external address, and next write data and stopping receipt of the read data while said comparison result receiving unit is receiving the activated busy signal.

15. The memory system according to claim 14, wherein:
said address comparison unit executes a comparison operation in synchronization with a first timing that is a point of time when a first time has passed from the supply of said external address;
said comparison result output unit outputs said busy signal in synchronization with a second timing that comes later than said first timing;
said access control unit outputs said access command and said external address in synchronization with a third timing that comes earlier than said first timing; and
said comparison result receiving unit receives said busy signal in synchronization with a fourth timing that comes later than said second timing.

16. The memory system according to claim 14, wherein said controller stops an internal clock for operating said access control unit while said comparison result receiving unit is receiving the activated busy signal.

17. The memory system according to claim 14, wherein:
said controller accesses a plurality of the semiconductor memories allocated in different address spaces from each other;
each of the semiconductor memories includes a busy terminal outputting said busy signal;
said comparison result output unit of each of the semiconductor memories sets a level of said busy terminal to a first logic level when activating said busy signal, while setting said busy terminal in an open state when inactivating said busy signal; and
the memory system further comprises:
a common signal line connecting the busy terminals to the comparison result receiving unit of said controller; and
a level fixed part connected to said common signal line and setting a level of said common signal line to a second logic level when all of the busy terminals are in the open state, the second logic level being opposite to said first logic level.

18. An operation method of a memory system that comprises a semiconductor memory having a plurality of banks operable simultaneously, and a controller controlling access to said semiconductor memory, comprising:
activating a busy signal when receiving an access command for a bank currently in an access operation and keeping activating the busy signal until the access operation currently executed is completed;
stopping outputting a next access command from the controller to said semiconductor memory while receiving the activated busy signal;
operating said semiconductor memory and said controller in synchronization with a clock;

accessing said semiconductor memory in synchronization with an internal clock generated from the clock;

stopping the internal clock in response to the activation of said busy signal; and restarting generation of said internal clock in response to inactivation of said busy signal.

19. The operation method of the memory system according to claim 18, further comprising:

operating said semiconductor memory and said controller in synchronization with a clock; and accessing said banks in synchronization with an internal clock generated from said clock, stopping the internal clock in response to the activation of said busy signal and restarting generation of said internal clock in response to inactivation of said busy signal.

* * * * *